United States Patent
Inoue et al.

(10) Patent No.: US 11,195,731 B2
(45) Date of Patent: Dec. 7, 2021

(54) SUBSTRATE PROCESSING DEVICE, SUBSTRATE PROCESSING METHOD, AND SUBSTRATE PROCESSING SYSTEM

(71) Applicant: SCREEN Holdings Co., Ltd., Kyoto (JP)

(72) Inventors: Masafumi Inoue, Kyoto (JP); Akihiko Taki, Kyoto (JP); Hiroki Taniguchi, Kyoto (JP); Takayoshi Tanaka, Kyoto (JP); Yuta Nakano, Kyoto (JP)

(73) Assignee: SCREEN Holdings Co., Ltd., Kyoto (JP)

(*) Notice: Subject to any disclaimer, the term of this patent is extended or adjusted under 35 U.S.C. 154(b) by 55 days.

(21) Appl. No.: 15/844,738

(22) Filed: Dec. 18, 2017

(65) Prior Publication Data
US 2018/0182649 A1  Jun. 28, 2018

(30) Foreign Application Priority Data
Dec. 28, 2016  (JP) .............................. JP2016-255335

(51) Int. Cl.
*H01L 21/67* (2006.01)
*H01L 21/268* (2006.01)
(Continued)

(52) U.S. Cl.
CPC .... *H01L 21/67115* (2013.01); *H01L 21/2686* (2013.01); *H01L 21/67017* (2013.01);
(Continued)

(58) Field of Classification Search
CPC .......... H01L 21/67115; H01L 21/6719; H01L 21/68764; H01L 21/68742; H01L 21/67017; C23C 16/45574; C23C 16/4558
(Continued)

(56) References Cited

U.S. PATENT DOCUMENTS 5,478,401 A * 12/1995 Tsunekawa ....... H01L 21/67109
134/1
5,520,743 A   5/1996 Takahashi
(Continued)

FOREIGN PATENT DOCUMENTS

CN   102414801 A   4/2012
CN   105206526 A   12/2015
(Continued)

OTHER PUBLICATIONS

Notification of Reason for Refusal dated May 13, 2019 in counterpart Korean Patent Application No. 10-2017-0177190 with English translation obtained from Global Dossier.
(Continued)

*Primary Examiner* — Aiden Lee
(74) *Attorney, Agent, or Firm* — Ostrolenk Faber LLP

(57) ABSTRACT

A substrate processing device includes a substrate holding table, an ultraviolet irradiator, a tubular member, a first gas supplying unit, and a second gas supplying unit. The ultraviolet irradiator is disposed facing to the substrate through an active space and configured to irradiate the substrate with ultraviolet light. The tubular member includes an inner surface surrounding a side surface of the substrate holding table, and at least one opening at a position facing to the side surface on the inner surface. The first gas supplying unit supplies gas to a space between the side surface of the substrate holding table and the inner surface of the tubular member through the at least one opening. The second gas supplying unit supplies gas to an active space between the substrate and the ultraviolet irradiator.

23 Claims, 17 Drawing Sheets

(51) Int. Cl.
    *H01L 21/677* (2006.01)
    *H01L 21/687* (2006.01)
(52) U.S. Cl.
    CPC .... *H01L 21/6719* (2013.01); *H01L 21/67173* (2013.01); *H01L 21/67703* (2013.01); *H01L 21/67748* (2013.01); *H01L 21/68742* (2013.01); *H01L 21/68764* (2013.01)
(58) Field of Classification Search
    USPC .............................. 118/715–733; 156/345.55
    See application file for complete search history.

(56) References Cited

U.S. PATENT DOCUMENTS

| | | | | |
|---|---|---|---|---|
| 6,413,317 | B1 * | 7/2002 | Miyazaki | H01L 21/67109 118/620 |
| 2001/0003271 | A1 * | 6/2001 | Otsuki | C23C 16/4404 118/723 I |
| 2003/0218456 | A1 * | 11/2003 | Brunner | H01L 21/67288 324/750.14 |
| 2006/0165904 | A1 * | 7/2006 | Ohara | H01L 21/67115 427/372.2 |
| 2008/0017114 | A1 * | 1/2008 | Watanabe | H01L 21/67115 118/725 |
| 2008/0178810 | A1 * | 7/2008 | Koizumi | C23C 16/45574 118/730 |
| 2009/0093135 | A1 * | 4/2009 | Matsushita | H01L 21/3105 438/798 |
| 2010/0075488 | A1 * | 3/2010 | Collins | C23C 16/45551 438/507 |
| 2011/0052833 | A1 | 3/2011 | Hanawa et al. | |
| 2011/0095207 | A1 | 4/2011 | Sant et al. | |
| 2011/0146705 | A1 | 6/2011 | Hart et al. | |
| 2015/0371894 | A1 | 12/2015 | Kaneda et al. | |
| 2016/0329223 | A1 | 11/2016 | Hirose | |
| 2016/0370712 | A1 | 12/2016 | Shibazaki | |

FOREIGN PATENT DOCUMENTS

| | | | |
|---|---|---|---|
| JP | H10-261593 A | | 9/1998 |
| JP | H11-126770 A | | 5/1999 |
| JP | 11-221535 | | 8/1999 |
| JP | 2001-023915 A | | 1/2001 |
| JP | 2001-293443 A | | 10/2001 |
| JP | 2004-282099 A | | 10/2004 |
| JP | 2006-203191 A | | 8/2006 |
| JP | 4017276 | | 9/2007 |
| JP | 2008-060221 | | 3/2008 |
| JP | 2009-4545 A | | 1/2009 |
| JP | 2009-094503 A | | 4/2009 |
| JP | 2011-135014 A | | 7/2011 |
| JP | 2011204944 A | * | 10/2011 |
| JP | 5752760 | | 5/2015 |
| JP | 2015-120129 A | | 7/2015 |
| JP | 2018-81981 A | | 5/2018 |
| KR | 10-0276426 B1 | | 12/2000 |
| KR | 10-2006-0130531 A | | 12/2006 |
| KR | 10-2015-0146440 A | | 12/2015 |
| TW | 201530688 A | | 8/2015 |
| TW | 201611908 A | | 4/2016 |

OTHER PUBLICATIONS

Office Action dated Apr. 3, 2019 and Search Report in counterpart Taiwanese Patent Application No. 106142690 with Japanese translation and partial English translation based on the Japanese translation.

Notice of Reasons for Refusal dated Jun. 2, 2020 in counterpart Japanese Patent Application No. 2016-255335 and English translation obtained from Global Dossier.

First Office Action dated Apr. 20, 2021 in corresponding Chinese Patent Application No. 201711404713.4 and Search Report with English translation obtained from the JPO.

* cited by examiner

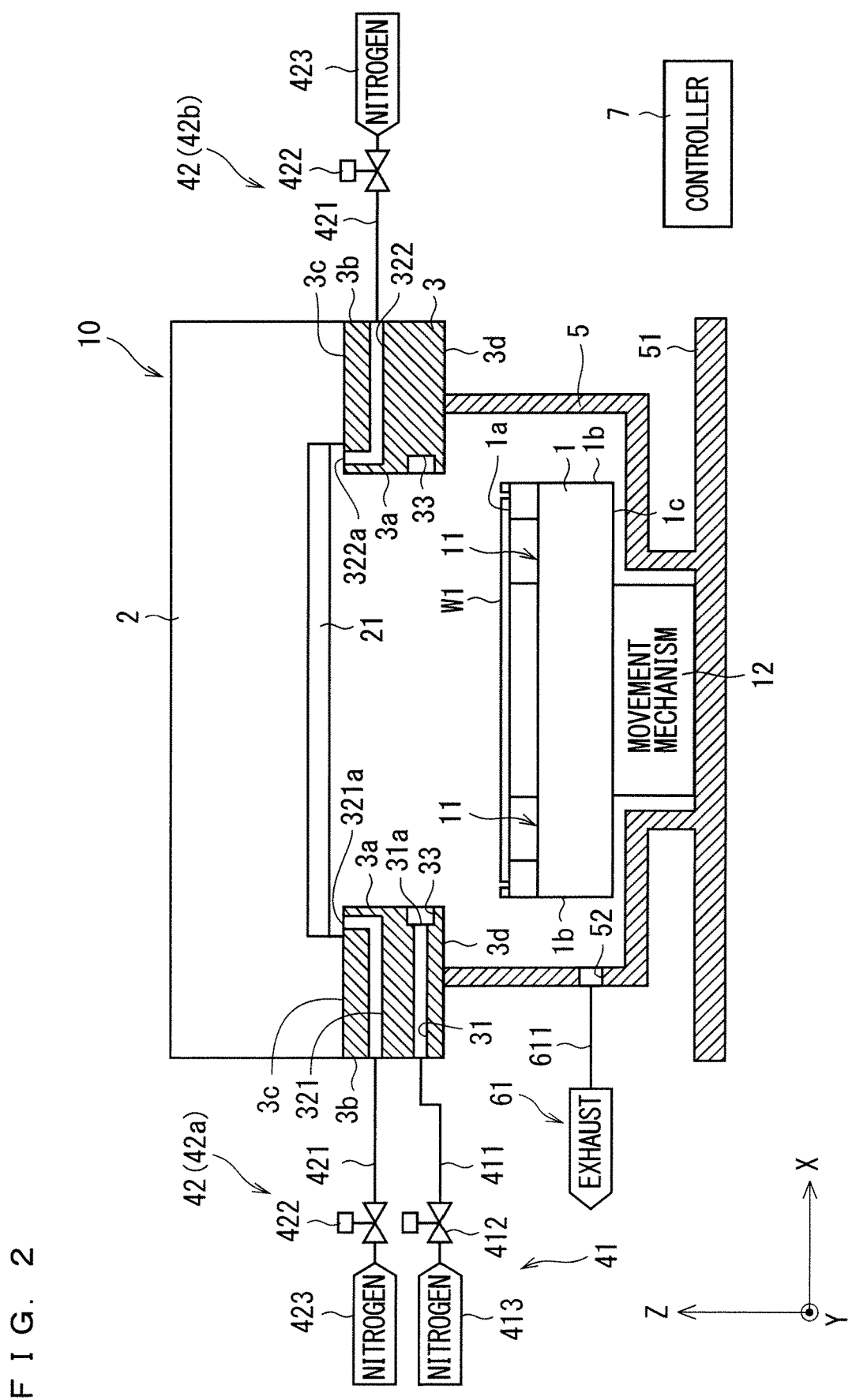

F I G. 2 1
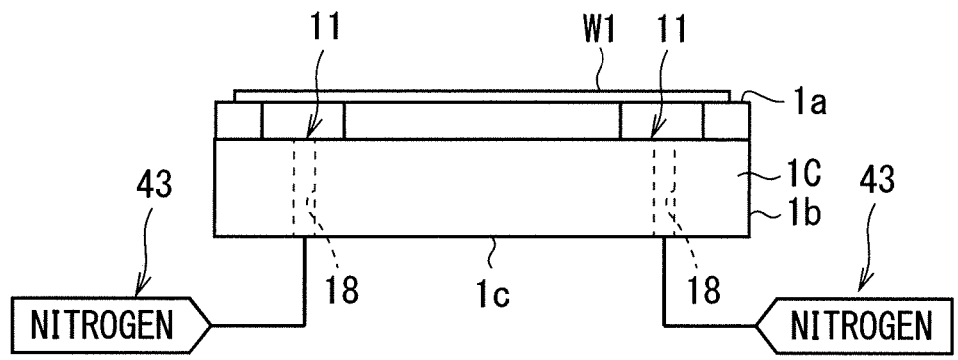
F I G. 2 2
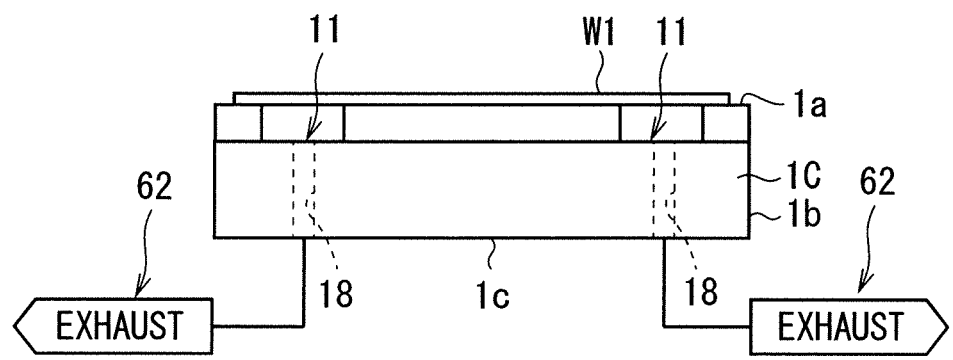

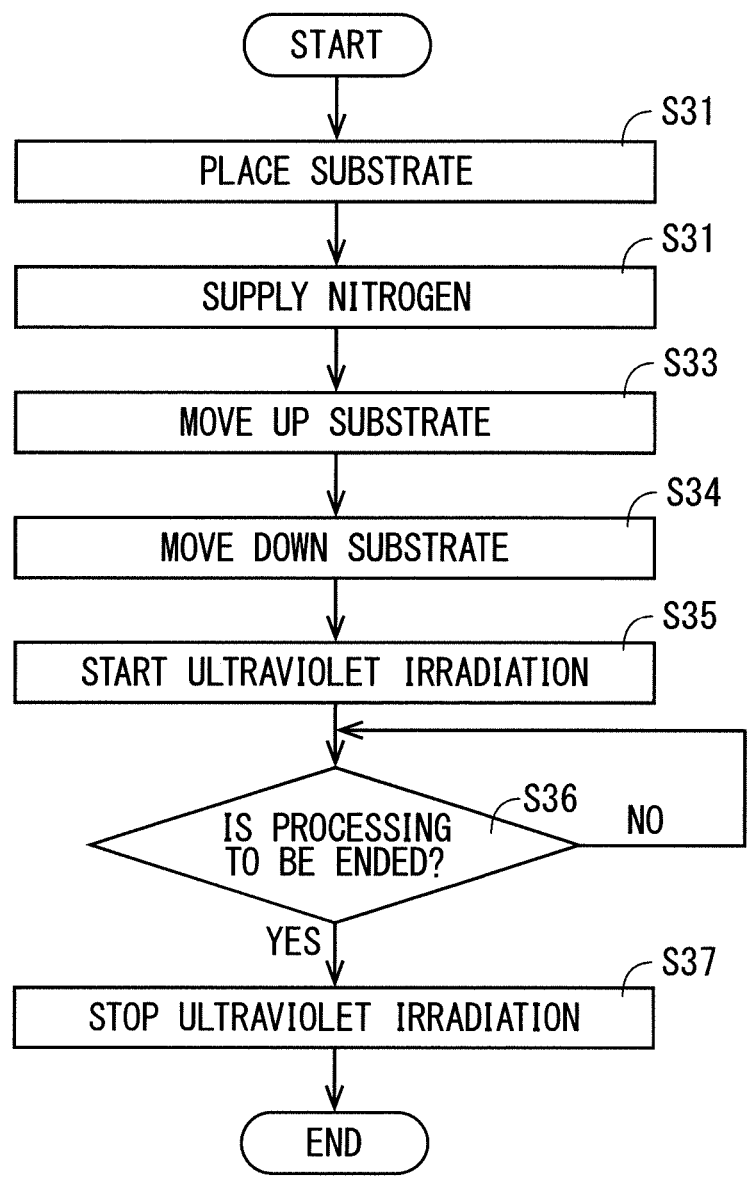

SUBSTRATE PROCESSING DEVICE, SUBSTRATE PROCESSING METHOD, AND SUBSTRATE PROCESSING SYSTEM

BACKGROUND OF THE INVENTION

Field of the Invention

The present invention relates to a substrate processing device, a substrate processing method, and a substrate processing system.

Description of the Background Art

In a conventional process of manufacturing a semiconductor substrate (hereinafter simply referred to as a "substrate"), a substrate processing device has been used to perform various kinds of processing on the substrate provided with an insulating film such as an oxide film. For example, a substrate having a surface on which a resist is patterned is supplied with processing liquid and subjected to processing such as etching on the surface thereof. In addition, processing to remove the resist on the substrate is performed after the etching or the like ends.

Before conveyed into the substrate processing device, a substrate to be processed by the substrate processing device is subjected to dry processing such as dry etching and plasma chemical vapor deposition (CVD). In such dry processing, electric charge is generated in the device, and the substrate is conveyed into the substrate processing device while being electrically charged (what is called carried-in electrical charging). Then, when processing liquid such as SPM liquid having a low specific resistance is supplied on the substrate in the substrate processing device, the electric charge in the device abruptly moves from the device to the processing liquid (in other words, discharges into the processing liquid), potentially causing damage on the device due to heat generated along with the movement.

To avoid this, an electrical charging prevention device has been conventionally used to prevent electrical charging of the substrate (refer to Japanese Patent Application Laid-Open No. 2008-60221, for example). This electrical charging prevention device includes a gas supply path and an irradiation unit. The irradiation unit irradiates a glass substrate with ultraviolet light. The gas supply path is communicated with a space between the glass substrate and the irradiation unit. Gas containing oxygen is supplied into the space through the gas supply path. In this state, the glass substrate is irradiated with ultraviolet light to obtain a hydrophilic characteristic of the surface thereof so that electrical charging of the glass substrate is prevented. The ultraviolet light changes oxygen in the space into ozone. The ozone promotes the hydrophilic characteristic of the glass substrate.

Japanese Patent Application Laid-Open No. 11-221535, Japanese Patent No. 4017276, and Japanese Patent No. 5752760 are exemplary technologies related to the present invention.

When air remains in a space between a substrate and an ultraviolet irradiator, ultraviolet light is absorbed by oxygen in the air, so that harmful ozone is generated and the intensity of ultraviolet light attenuates. For this reason, the ultraviolet irradiator needs to start ultraviolet irradiation after a predetermined atmosphere is achieved in the space. For example, the ultraviolet irradiation is started when the concentration of oxygen in the space reaches at a predetermined range.

It is desirable that the predetermined atmosphere is achieved in the space in a shorter time to improve the throughput of substrate processing.

SUMMARY OF THE INVENTION

The present invention is directed to a substrate processing device configured to irradiate a substrate with ultraviolet light.

A substrate processing device according to a first aspect includes a substrate holding table, an ultraviolet irradiator, a tubular member, a first gas supplying unit, and a second gas supplying unit. The substrate holding table includes a first upper surface on which a substrate is placed and a side surface. The ultraviolet irradiator is disposed facing to the substrate with an active space therebetween and configured to irradiate the substrate with ultraviolet light. The tubular member includes an inner surface surrounding the side surface of the substrate holding table, and at least one side opening at a position facing to the side surface on the inner surface. The first gas supplying unit supplies gas to a space between the side surface of the substrate holding table and the inner surface of the tubular member through the at least one side opening. The second gas supplying unit supplies gas to an active space between the substrate and the ultraviolet irradiator.

In the substrate processing device, a substrate processing method, and a substrate processing system, gas flowing through the space (hereinafter referred to as a communication space) between the side surface of the substrate holding table and the inner surface of the tubular member functions as a barrier against gas flowing to the active space. For example, a space (non-active space) opposite to the ultraviolet irradiator with respect to the substrate holding table is communicated with the active space through the communication space. With this configuration, air in the non-active space is unlikely to flow into the active space due to gas in the communication space. In other words, the air in the non-active space, which is different from a predetermined atmosphere, can be prevented from flowing to the active space. Thus, the predetermined atmosphere can be achieved in the active space in a shorter time.

A substrate processing device according to a second aspect is the substrate processing device according to the first aspect in which the inner surface of the tubular member includes a first groove extending in a circumferential direction of the inner surface. The at least one side opening is provided to the first groove.

A substrate processing device according to a third aspect is the substrate processing device according to the first or second aspect in which the at least one side opening faces in a circumferential direction of the inner surface.

A substrate processing device according to a fourth aspect is the substrate processing device according to the third aspect in which the at least one side opening includes a plurality of side openings arranged at intervals in the circumferential direction of the inner surface.

A substrate processing device according to a fifth aspect is the substrate processing device according to the fourth aspect in which an opening axis of each of the plurality of side openings is aligned with one of clockwise and anti-clockwise directions along the circumferential direction.

A substrate processing device according to a sixth aspect is the substrate processing device according to the fourth or fifth aspect further including a rotation mechanism configured to rotate the substrate holding table in the one direction about an axis vertical to a main surface of the substrate.

A substrate processing device according to a seventh aspect is the substrate processing device according to any one of the first to sixth aspects in which the at least one side opening includes at least one first layer opening and at least one second layer opening. The at least one first layer opening is disposed at a position different from the position of at least one second layer opening in a direction in which the ultraviolet irradiator and the substrate holding table are arranged.

A substrate processing device according to an eighth aspect is the substrate processing device according to the seventh aspect in which the at least one first layer opening includes a plurality of first layer openings, and the at least one second layer opening includes a plurality of second layer openings. The plurality of first layer openings are arranged at intervals in the circumferential direction of the inner surface, and the plurality of second layer openings are each disposed at a position different from the position of any of the first layer openings in the circumferential direction. An opening axis of each of the first layer openings and the second layer openings is aligned with one of clockwise and anticlockwise directions along the circumferential direction.

A substrate processing device according to a ninth aspect is the substrate processing device according to the seventh or eighth aspect in which the inner surface of the tubular member further includes a second groove extending in the circumferential direction of the inner surface. The first groove and the second groove are disposed at positions different from each other in the direction in which the ultraviolet irradiator and the substrate holding table are arranged. The at least one first layer opening is provided to the first groove, and the at least one second layer opening is provided to the second groove.

A substrate processing device according to a tenth aspect is the substrate processing device according to any one of the first to ninth aspects in which the tubular member further includes at least one gas supply opening. The at least one gas supply opening supplies gas to the active space between the substrate and the ultraviolet irradiator.

A substrate processing device according to an eleventh aspect is the substrate processing device according to the tenth aspect in which the at least one gas supply opening includes a plurality of gas supply openings. The tubular member includes a second upper surface facing to the ultraviolet irradiator through a void space. The plurality of gas supply openings are provided to the second upper surface and disposed at intervals in the circumferential direction of the inner surface.

A substrate processing device according to a twelfth aspect is the substrate processing device according to the tenth or eleventh aspect in which the tubular member further includes at least one gas exhaust opening. The at least one gas exhaust opening is disposed at a position different from the position of the at least one gas supply opening in the circumferential direction of the inner surface, and exhausts gas in the active space between the substrate and the ultraviolet irradiator.

A substrate processing device according to a thirteenth aspect is the substrate processing device according to the twelfth aspect in which the at least one gas supply opening is disposed on a half side of the inner surface in the circumferential direction, and the at least one gas exhaust opening is disposed on the other side of the inner surface in the circumferential direction.

A substrate processing device according to a fourteenth aspect is the substrate processing device according to any one of the first to thirteenth aspects in which the first upper surface of the substrate holding table includes a conveyance groove extending from a periphery of the first upper surface. The substrate holding table includes a gas supply or exhaust conveyance groove opening in the conveyance groove.

A substrate processing device according to a fifteenth aspect is the substrate processing device according to any one of the first to thirteenth aspects in which the substrate holding table includes, on the first upper surface, a plurality of protrusions protruding toward the ultraviolet irradiator and supporting the substrate, and includes a gas supply or exhaust upper surface opening at a position different from the positions of the plurality of protrusions on the first upper surface.

A substrate processing device according to a sixteenth aspect is the substrate processing device according to any one of first to thirteenth aspects in which the first upper surface of the substrate holding table is provided with a plurality of elevation protrusions and a plurality of fixed protrusions. The plurality of elevation protrusions are configured to be elevated and lowered in a direction in which the ultraviolet irradiator and the substrate holding table are arranged. The plurality of fixed protrusions protrude toward the ultraviolet irradiator at positions closer to the center of the substrate than the plurality of elevation protrusions. When the plurality of elevation protrusions are elevated toward the ultraviolet irradiator, the substrate is not supported by the plurality of fixed protrusions but is supported by the plurality of elevation protrusions. When the plurality of elevation protrusions are lowered toward the substrate holding table, the substrate is supported by at least the plurality of fixed protrusions.

A substrate processing device according to a seventeenth aspect is the substrate processing device according to the sixteenth aspect in which the substrate holding table includes a gas supply or exhaust upper surface opening on the first upper surface.

A substrate processing device according to an eighteenth aspect is the substrate processing device according to any one of the first to seventeenth aspects further including a moving mechanism. The moving mechanism relatively moves the ultraviolet irradiator and the substrate holding table between a first position and a second position. The distance between the substrate and the ultraviolet irradiator at the first position is shorter than the distance between the substrate and the ultraviolet irradiator at the second position. The at least one side opening faces to the side surface of the substrate holding table while the substrate holding table is stopped at the first position.

A substrate processing method according to a nineteenth aspect includes first to third processes. The first process places a substrate on a first upper surface of a substrate holding table including the first upper surface and a side surface. The second process supplies gas to a space between the side surface of the substrate holding table and an inner surface of a tubular member including at least one side opening at a position facing to the side surface on the inner surface, through the at least one side opening, the inner surface surrounding the side surface of the substrate holding table, and supplies gas to an active space between the substrate and an ultraviolet irradiator disposed facing to the substrate through the active space. The third process irradiates, by the ultraviolet irradiator, the substrate with ultraviolet light after the first process and the second process.

A substrate processing method according to a twentieth aspect is the substrate processing method according to the nineteenth aspect in which the second process includes: a process (a) of starting gas supply to the active space and gas supply through at least one side opening while the substrate holding table is retracted from inside the inner surface of the tubular member in a direction departing from the ultraviolet irradiator; and a process (b) of relatively moving, after the process (a), the ultraviolet irradiator and the substrate holding table so that the side surface of the substrate holding table faces to the inner surface of the tubular member.

A substrate processing method according to a twenty-first aspect is the substrate processing method according to the nineteenth or twentieth aspect in which the second process includes: a process (A) of relatively moving the ultraviolet irradiator and the substrate holding table so that the substrate holding table becomes closer to the ultraviolet irradiator; a process (B) of starting gas supply to a space between the substrate and the ultraviolet irradiator and gas supply through the at least one side opening; and a process (C) of relatively moving, after the process (A) and the process (B), the ultraviolet irradiator and the substrate holding table so that the substrate holding table becomes further away from the ultraviolet irradiator.

A substrate processing system according to a twenty-second aspect is includes: a housing and holding unit configured to house a substrate; a substrate processing unit configured to perform processing on the substrate; and a substrate passing unit that is positioned between the housing and holding unit and the substrate processing unit and through which the substrate passes when reciprocated between the housing and holding unit and the substrate processing unit. The substrate passing unit includes the substrate processing device according to any one of the first to eighteenth aspects.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a diagram schematically illustrating an exemplary configuration of a substrate processing device;

FIG. 21 is a diagram illustrating another exemplary configuration of the substrate holding table;

FIG. 22 is a diagram illustrating another exemplary configuration of the substrate holding table;

FIG. 23 is a flowchart illustrating an exemplary operation of the substrate processing device;

DESCRIPTION OF THE PREFERRED EMBODIMENTS

Preferred embodiments of the present invention will be described below in detail with reference to the accompanying drawings.

Exemplary Entire Configuration of Substrate Processing System

Figure 1:
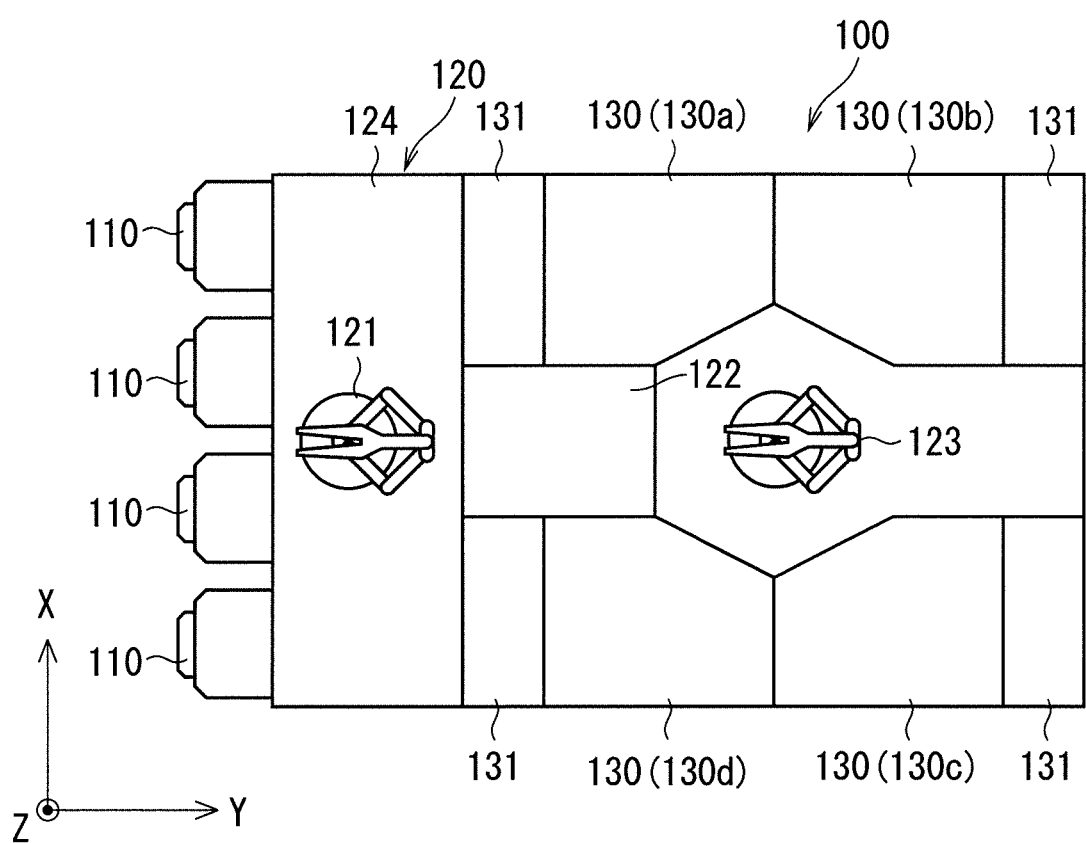
FIG. 1 is a diagram schematically illustrating an exemplary configuration of a substrate processing system.

FIG. 1 is a diagram schematically illustrating an exemplary entire configuration of a substrate processing system 100. The size of each component and the number thereof in FIG. 1 or any other subsequent drawing are exaggerated or simplified as necessary to facilitate understanding.

The substrate processing system 100 is a device configured to perform various kinds of processing on a semiconductor substrate. The substrate processing system 100 includes, for example, a container holding unit 110, a substrate passing unit 120, and a substrate processing unit 130. The container holding unit 110 holds a substrate container. The substrate container houses, for example, a plurality of substrates. In the example illustrated in FIG. 1, a plurality of the container holding units 110 are arrayed in a one direction (hereinafter also referred to as an X direction) parallel to a horizontal plane.

The substrate processing unit 130 is a device configured to perform predetermined processing on the substrate. In the example illustrated in FIG. 1, a plurality of the substrate processing units 130 (in the illustrated example, substrate processing units 130a to 130d) are provided. The substrate processing units 130a to 130d each perform various kinds of processing on the substrate. For the purpose of illustration, it is assumed that the substrate receives processing through the substrate processing units 130a to 130d in this order. For example, the substrate processing unit 130a supplies the substrate with processing liquid (processing liquid such as chemical, rinse liquid, or isopropyl alcohol (IPA) liquid). Accordingly, processing in accordance with the processing liquid is performed on the substrate. It is not preferable for later processing at the substrate processing unit 130c that electric charge is accumulated on the substrate. Some organic substances remain as impurities on a main surface of the substrate through processing (for example, processing using IPA) by the substrate processing unit 130*b*, and thus are desirably removed.

The substrate passing unit 120 is positioned between the container holding units 110 and the substrate processing units 130*a* to 130*d*. A substrate yet to be processed is passed from the container holding units 110 to the substrate processing unit 130*a* through the substrate passing unit 120. Having processed at the substrate processing unit 130*a*, the substrate is passed from the substrate processing unit 130*a* to the container holding units 110 or the substrate processing unit 130*b* through the substrate passing unit 120. Temporally sequential conveyance of the substrate between the substrate processing units 130*b* to 130*d* is performed in the same manner.

The substrate passing unit 120 includes, for example, an indexer robot 121, a passing unit 122, and a conveyance robot 123. The indexer robot 121 can be reciprocated through an indexer conveyance path 124 to be described next in the X direction. The indexer conveyance path 124 extends in the X direction side by side with the plurality of container holding units 110. The indexer robot 121 can stop at positions facing to the respective container holding units 110 in the indexer conveyance path 124.

The indexer robot 121 includes, for example, an arm and a hand. The hand is provided at a leading end of the arm and capable of holding a substrate and releasing the held substrate. The hand can be reciprocated in a direction (hereinafter also referred to as a Y direction) parallel to a horizontal plane and vertical to the X direction by driving the arm. While facing to any of the container holding units 110, the indexer robot 121 can move the hand to the container holding unit 110 to take a substrate yet to be processed out of the container holding units 110, or can pass a processed substrate to the container holding unit 110.

The passing unit 122 is positioned on a side opposite to the container holding units 110 with respect to the indexer conveyance path 124. For example, the passing unit 122 may be disposed at a position facing to a central part of the indexer conveyance path 124 in the X direction. For example, the passing unit 122 may include a placement table or rack on which a substrate is to be placed. The indexer robot 121 can rotate the arm in a horizontal plane by 180°. In this manner, the indexer robot 121 can move the hand to the passing unit 122. The indexer robot 121 can pass a substrate taken out of the container holding units 110 to the passing unit 122 or take a substrate placed at the passing unit 122 out of the passing unit 122.

The conveyance robot 123 is provided on a side opposite to the indexer conveyance path 124 with reference to the passing unit 122. The plurality of (in FIG. 1, four) the substrate processing units 130 are disposed surrounding the conveyance robot 123. In the example illustrated in FIG. 1, fluid boxes 131 are provided adjacent to the respective substrate processing units 130. Each fluid box 131 can supply processing liquid to the adjacent substrate processing unit 130 or collect used processing liquid from the substrate processing unit 130.

Similarly to the indexer robot 121, the conveyance robot 123 includes an arm and a hand. The conveyance robot 123 can take a substrate out of the passing unit 122 or pass a substrate to the passing unit 122. The conveyance robot 123 can pass a substrate to each substrate processing unit 130 or take the substrate out of the substrate processing unit 130. The indexer robot 121 and the conveyance robot 123 can be each regarded as a conveying means for conveying a substrate.

This configuration allows execution of schematic operation as follows. Specifically, semiconductor substrates housed in the respective container holding units 110 are sequentially conveyed to the passing unit 122 by the indexer robot 121. Then, the substrates are sequentially conveyed to the substrate processing units 130*a* to 130*d* by the conveyance robot 123 to receive processing at the substrate processing units 130*a* to 130*d*. Having been provided with this series of processing, the substrates are returned to the container holding units 110 through the passing unit 122 and the indexer robot 121.

Substrate Processing Device

Figure 3:
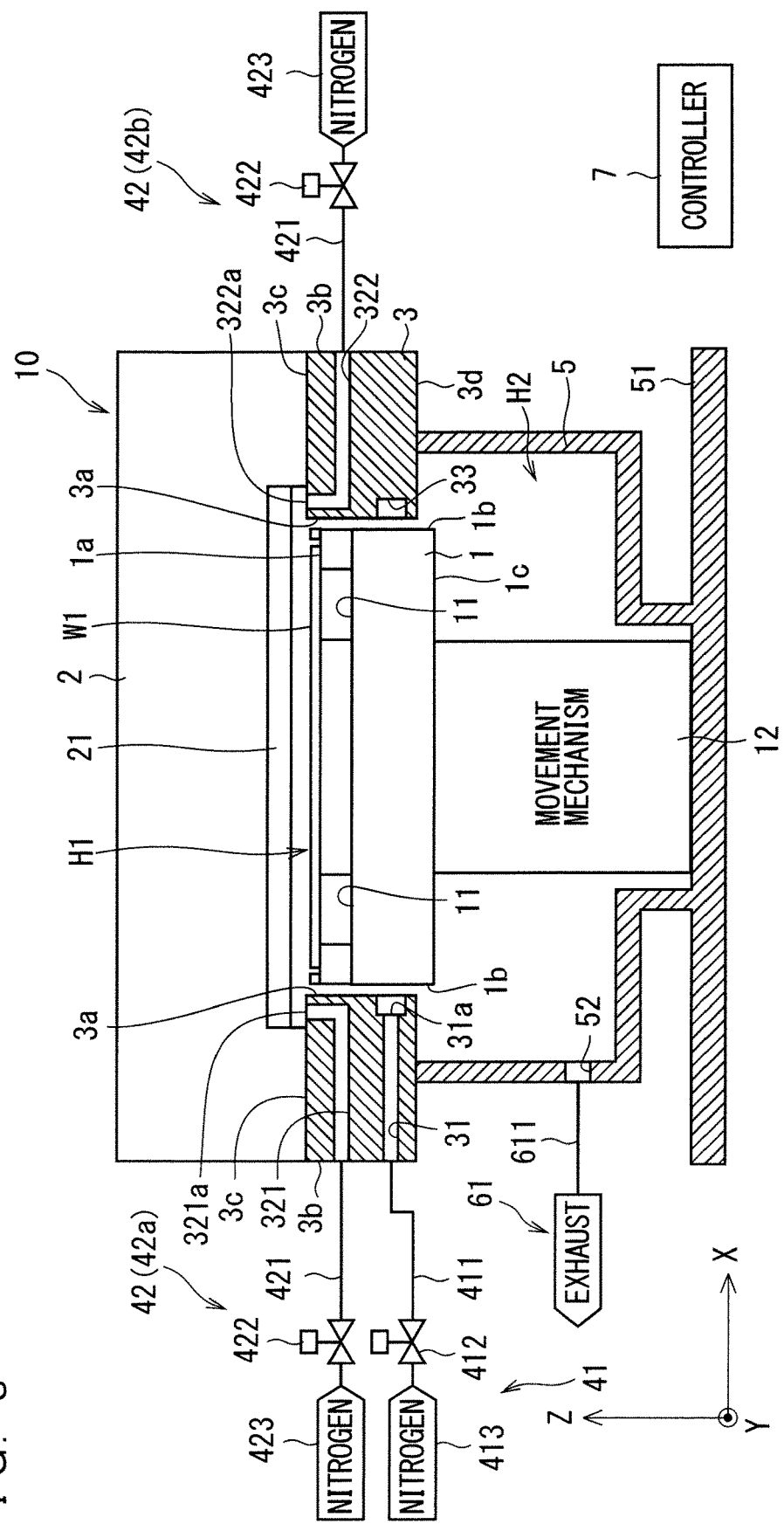
FIG. 3 is a diagram schematically illustrating an exemplary configuration of the substrate processing device.

FIGS. 2 and 3 are each a diagram schematically illustrating an exemplary configuration of a substrate processing device 10. The substrate processing device 10 may be provided to, for example, the passing unit 122. FIGS. 2 and 3 each illustrate the exemplary configuration along, for example, a section vertical to the Y direction. The substrate processing device 10 does not necessarily need to be provided to the passing unit 122, but may be provided, for example, as the substrate processing unit 130*d*. In other words, the substrate processing device 10 may be provided as part of the plurality of substrate processing units 130.

The substrate processing device 10 includes a substrate holding table 1, a movement mechanism 12, an ultraviolet irradiator 2, a tubular member 3, a first gas supplying unit 41, a second gas supplying unit 42, and a gas exhaust unit 61.

Substrate Holding Table

The substrate holding table 1 is a member configured to horizontally hold a substrate W1. The substrate W1 as a semiconductor substrate (in other words, a semiconductor wafer) has a substantially circular flat plate shape. The substrate holding table 1 has a cylindrical shape, and has an upper surface 1*a*, a side surface 1*b*, and a lower surface 1*c*. The side surface 1*b* couples the periphery of the upper surface 1*a* with the periphery of the lower surface 1*c*. The substrate W1 is placed on the upper surface 1*a* of the substrate holding table 1.

Figure 4:
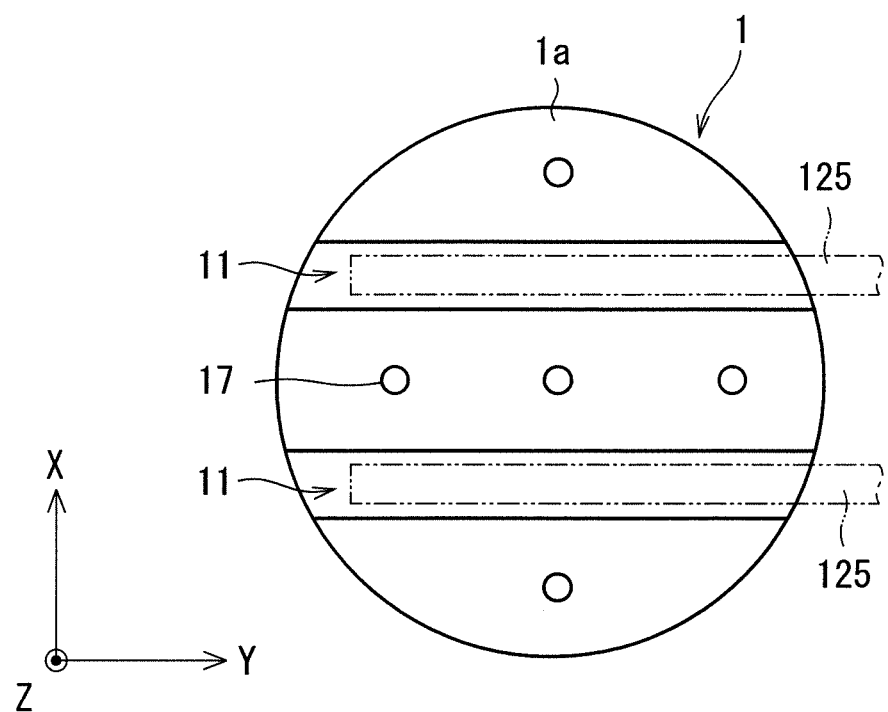
FIG. 4 is a diagram schematically illustrating an exemplary configuration of a substrate holding table.

FIG. 4 schematically illustrates an exemplary configuration of the substrate holding table 1 when viewed from the upper surface 1*a* side. As exemplarily illustrated in FIGS. 2 to 4, a pair of grooves (conveyance groove) 11 are formed in the upper surface 1*a*. Hands 125 of the indexer robot 121 or the conveyance robot 123 are inserted into the pair of grooves 11. The pair of grooves 11 extend from part of the periphery of the upper surface 1*a* of the substrate holding table 1 in a direction (in the illustrated example, the Y direction) parallel to a horizontal plane, and reach at another part of the periphery of the upper surface 1*a*. In other words, the pair of grooves 11 each have both ends facing in the Y direction. The pair of grooves 11 extend in parallel to each other. The pair of grooves 11 are disposed at positions on both sides of the center of the upper surface 1*a* of the substrate holding table 1. The grooves 11 each have a width (width in the X direction) larger than the width of each hand 125 and has a depth (depth in the vertical direction (also referred to as a Z direction)) larger than the thickness (thickness in the Z direction) of the hand 125.

The substrate W1 is placed on the substrate holding table 1 as described below. Specifically, the substrate W1 is conveyed to a position above the substrate holding table 1 while being placed on the hands 125. Subsequently, the hands 125 move toward the substrate holding table 1 from above. Along with this movement, the hands 125 are inserted into the pair of grooves 11 from above. Through the movement, the substrate W1 is placed on the substrate holding table 1 and separated from the hands 125. Thereafter, the indexer robot 121 or the conveyance robot 123 moves the hands 125 in the Y direction to remove the hands 125 from inside the grooves 11. In this manner, the substrate W1 is placed on the substrate holding table 1.

As exemplarily illustrated in FIG. 4, the upper surface 1a of the substrate holding table 1 is provided with, in regions different from the grooves 11, a plurality of protrusion shapes (hereinafter referred to as protrusions 17) protruding toward the substrate W1. The protrusions 17 are also referred to as pins. The protrusions 17 each have, for example, a cylindrical shape. The protrusions 17 are made of, for example, quartz. When the protrusions 17 are provided, the substrate W1 is supported by leading ends of the protrusions 17. Each protrusion 17 has a height (height in the Z direction) larger than the amount of deflection of the substrate W1. With this configuration, the substrate W1 does not contact with the upper surface 1a at any position other than the protrusions 17. The height of each protrusion 17 is set to be, for example, 0.5 mm approximately.

Ultraviolet Irradiator

The ultraviolet irradiator 2 is disposed on an upper side (side opposite to the substrate holding table 1) of the substrate W1. Thus, the ultraviolet irradiator 2, the substrate W1, and the substrate holding table 1 are arranged in this order in the Z direction. The ultraviolet irradiator 2 can generate ultraviolet light and irradiate a main surface (main surface opposite to the substrate holding table 1) of the substrate W1 with the ultraviolet light. The ultraviolet irradiator 2 is, for example, an excimer ultraviolet (UV) lamp. The ultraviolet irradiator 2 includes a quartz tube filled with, for example, electric discharge gas (for example, noble gas or noble-gas-halogen compound), and a pair of electrodes housed in the quartz tube. The electric discharge gas exists between the pair of electrodes. High-frequency application of high voltage between the pair of electrodes excites the electric discharge gas into an excimer state. The electric discharge gas generates ultraviolet light when returning from the excimer state to the ground state.

The ultraviolet irradiator 2 may have, for example, a flat plate shape. The ultraviolet irradiator 2 is disposed in, for example, a posture with the normal direction thereof aligned with the Z direction. In other words, the ultraviolet irradiator 2 is a horizontally disposed surface light source. Alternatively, the ultraviolet irradiator 2 may be provided as an array of a plurality of cylindrical ultraviolet-unit irradiators. For example, each ultraviolet-unit irradiator is disposed in a posture with the central axis thereof aligned with the X direction. In this case, the plurality of ultraviolet-unit irradiators are disposed in parallel to each other in the Y direction. Thus, with this configuration, the plurality of horizontally disposed ultraviolet-unit irradiators effectively serve as a surface light source.

The ultraviolet irradiator 2 includes quartz glass plate 21 for protection. The quartz glass plate 21 is provided on a side closer to the substrate W1. The quartz glass plate 21 is translucent to ultraviolet light and has thermal resistance and corrosion resistance. The quartz glass plate 21 can protect the ultraviolet irradiator 2 against external force and against an atmosphere between the ultraviolet irradiator 2 and the substrate W1. Ultraviolet light generated in the ultraviolet irradiator 2 is incident on the substrate W1 through the quartz glass plate 21.

Movement Mechanism 12

The movement mechanism 12 can move the substrate holding table 1 in the Z direction. For example, the movement mechanism 12 is attached to the lower surface 1c of the substrate holding table 1. The movement mechanism 12 can reciprocate the substrate holding table 1 between a first position (refer to FIG. 3) close to the ultraviolet irradiator 2 and a second position (refer to FIG. 2) far away from the ultraviolet irradiator 2. As described later, the first position is the position of the substrate holding table 1 when the substrate W1 is provided with processing using ultraviolet light, and the second position is the position of the substrate holding table 1 when the substrate W1 is passed over. The distance between the substrate holding table 1 at the first position and the ultraviolet irradiator 2 is shorter than the distance between the substrate holding table 1 at the second position and the ultraviolet irradiator 2. The movement mechanism 12 is, for example, a hydraulic cylinder or a uniaxially stage. The movement mechanism 12 may be covered by a bellows surrounding the movement mechanism 12.

Tubular Member and Gas Supplying Unit

Figure 5:
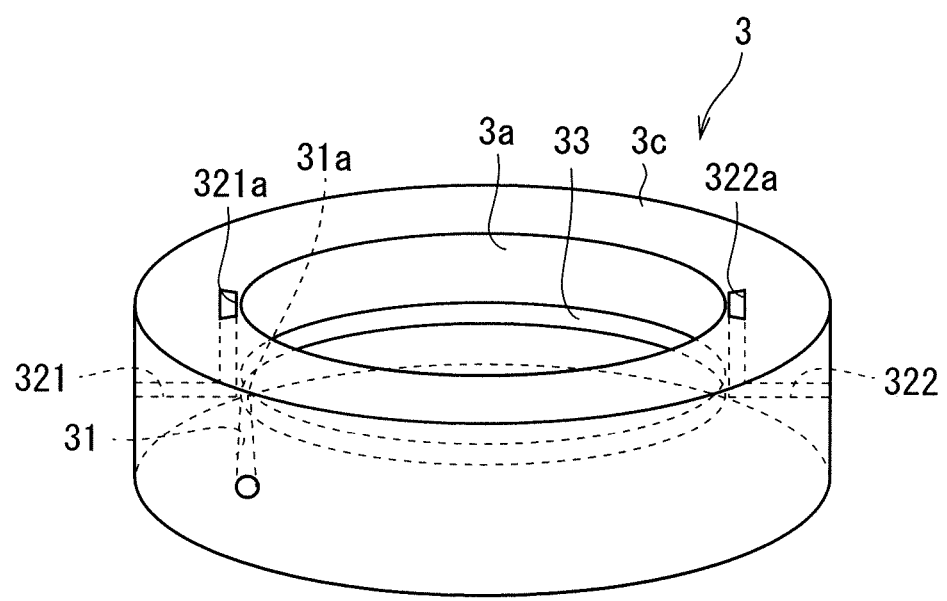
FIG. 5 is a perspective view schematically illustrating an exemplary configuration of a tubular member.
Figure 6:
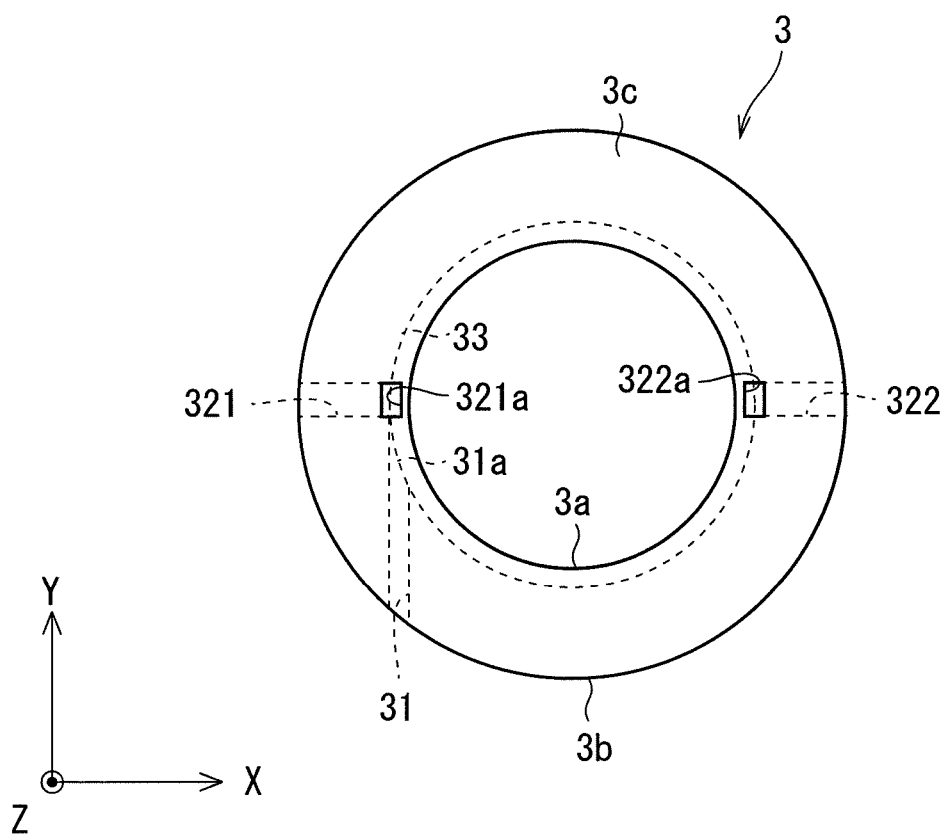
FIG. 6 is a diagram schematically illustrating an exemplary configuration of the tubular member.

The tubular member 3 has an inner peripheral surface (inner surface) 3a, an outer peripheral surface 3b, an upper surface 3c, and a lower surface 3d, and has a tubular shape. The upper surface 3c couples the inner peripheral surface 3a with the outer peripheral surface 3b and is on a side closer to the ultraviolet irradiator 2. The lower surface 3d couples the inner peripheral surface 3a with the outer peripheral surface 3b and is on a side opposite to the ultraviolet irradiator 2. FIG. 5 is a perspective view schematically illustrating an exemplary configuration of the tubular member 3, and FIG. 6 is a diagram schematically illustrating an exemplary configuration of the tubular member 3 when viewed in the Z direction. The tubular member 3 has a cylindrical shape. The inner peripheral surface 3a of the tubular member 3 has a diameter larger than that of the side surface 1b of the substrate holding table 1. As illustrated in FIG. 3, the inner peripheral surface 3a of the tubular member 3 surrounds the side surface 1b of the substrate holding table 1 while the substrate holding table 1 is stopped at the first position.

While the substrate holding table 1 is stopped at the first position (FIG. 3), the ultraviolet irradiator 2 emits ultraviolet light. Accordingly, the substrate W1 is provided with processing using ultraviolet light. Simultaneously, the substrate W1 is surrounded by the ultraviolet irradiator 2, the tubular member 3, and the substrate holding table 1 while the substrate holding table 1 is stopped at the first position. Accordingly, in this state, the substrate W1 cannot be easily taken out of the substrate holding table 1.

Thus, the movement mechanism 12 moves the substrate holding table 1 to the second position (FIG. 2). Accordingly, the substrate holding table 1 is retracted from inside the inner peripheral surface 3a of the tubular member 3 in a direction departing from the ultraviolet irradiator 2. At the second position, the substrate W1 is positioned on a lower side (side opposite to the ultraviolet irradiator 2) of the lower surface 3d of the tubular member 3 in the vertical direction. This configuration allows the indexer robot 121 or the conveyance robot 123 to move the substrate W1 in the Y direction without being encumbered by the tubular member 3, thereby taking out the substrate W1. While the substrate holding table 1 is stopped at the second position, the indexer robot 121 or the conveyance robot 123 can place the substrate W1 on the substrate holding table 1.

The tubular member 3 includes a first through-hole 31 and second through-holes 321 and 322. The following first describes the second through-holes 321 and 322. The second through-holes 321 and 322 penetrates through the tubular member 3 and is communicated with a space between the ultraviolet irradiator 2 and the substrate W1. Hereinafter, the space is also referred to as an active space H1. Specifically, the second through-holes 321 and 322 each have one end opened at the upper surface 3c of the tubular member 3. Hereinafter, the opened ends of the second through-holes 321 and 322 are also referred to as openings (gas supply opening) 321a and 322a, respectively. The upper surface 3c of the tubular member 3 faces to the ultraviolet irradiator 2 through a void space at positions at which the openings 321a and 322a are provided. The active space H1 is continuous with a space between each of the openings 321a and 322a and the ultraviolet irradiator 2. In other words, the second through-holes 321 and 322 are communicated with the active space H1. The openings 321a and 322a are disposed at positions facing to each other with respect to the central axis of the inner peripheral surface 3a.

The other end of each of the second through-holes 321 and 322 is opened at the outer peripheral surface 3b of the tubular member 3. The other end of each of the second through-holes 321 and 322 is coupled with the second gas supplying unit 42. Specifically, the other end of the second through-hole 321 is connected with a second gas supplying unit 42a, and the other end of the second through-hole 322 is connected with a second gas supplying unit 42b. The second gas supplying units 42a and 42b can supply gas such as oxygen or inert gas (for example, nitrogen or argon) to the active space H1 through the respective second through-holes 321 and 322. In other words, the second through-holes 321 and 322 function as gas supply paths.

The second gas supplying units 42a and 42b each include a pipe 421, an on-off valve 422, and a gas container 423. The second gas supplying units 42a and 42b are identical to each other except for where the pipe 421 is connected. The following thus first describes any common configuration therebetween. The gas container 423 contains gas to be supplied to the active space H1. The gas container 423 is coupled with one end of the pipe 421. The on-off valve 422 is provided to the pipe 421 to switch opening and closing of the pipe 421. The following next describes where the other end of the pipe 421 of each of the second gas supplying units 42a and 42b is connected. The other end of the pipe 421 of the second gas supplying unit 42a is coupled with the other end of the second through-hole 321, and the other end of the pipe 421 of the second gas supplying unit 42b is coupled with the other end of the second through-hole 322.

In the example illustrated in FIGS. 2 and 3, the openings 321a and 322a face toward the ultraviolet irradiator 2 in the Z direction. Gas discharged from the openings 321a and 322a flows in a radial direction after hitting the ultraviolet irradiator 2, and collides with each other in a central part of the substrate W1, before flowing toward the substrate W1 in the Z direction and then flowing along the main surface of the substrate W1. In this manner, the pressure of the gas is dispersed through the collision with the ultraviolet irradiator 2, thereby achieving more uniform pressure distribution in the active space H1. In addition, the gas can flow from the central part of the substrate W1 to the periphery thereof directly above the substrate W1.

The first through-hole 31 penetrates through the tubular member 3 and has one end opened at the inner peripheral surface 3a of the tubular member 3. Hereinafter, the one end of the first through-hole 31 at the inner peripheral surface 3a side is also referred to as an opening (side opening) 31a. The opening 31a of the first through-hole 31 is positioned on a lower side (side opposite to the ultraviolet irradiator 2) of the openings 321a and 322a of the second through-holes 321 and 322.

While the substrate holding table 1 is stopped at the first position (FIG. 3), the opening 31a faces to the side surface 1b of the substrate holding table 1. More specifically, the opening 31a faces to the side surface 1b between a bottom surface of each groove 11 of the substrate holding table 1 and the lower surface 1c of the substrate holding table 1. Accordingly, the grooves 11 are not disposed in an XY plane passing through the opening 31a so that the inner peripheral surface 3a of the tubular member 3 and the side surface 1b of the substrate holding table 1 form a space (hereinafter also referred to as a ring space) in a substantially ring shape.

The ring space is positioned between the active space H1 and a space (hereinafter also referred to as a non-active space) H2 on a lower side of the tubular member 3. In other words, the active space H1 and the non-active space H2 are communicated with each other through the ring space.

The first through-hole 31 has one end opened at the outer peripheral surface 3b of the tubular member 3. The first through-hole 31 has the other end connected with the first gas supplying unit 41. The first gas supplying unit 41 can supply gas such as oxygen or inert gas (for example, nitrogen or argon) to the ring space through the first through-hole 31. Thus, the first through-hole 31 functions as a gas supply path. The first gas supplying unit 41 supplies gas same as that supplied by the second gas supplying unit 42. The first gas supplying unit 41 includes a pipe 411, an on-off valve 412, and a gas container 413. The gas container 413 contains gas to be supplied to the ring space. The gas container 413 is coupled with one end of the pipe 411. The on-off valve 412 is provided to the pipe 411 to switch opening and closing of the pipe 411. The pipe 411 has the other end coupled with the other end of the first through-hole 31.

The direction of an opening axis of the opening 31a (defined as a direction extending outward from inside the first through-hole 31 among positive and negative directions along the normal of an opening surface that defines the opening 31a. The same applies in the following) may be a direction along the radial direction of the inner peripheral surface 3a as exemplarily illustrated in FIGS. 2 and 3. In other words, part of the first through-hole 31, which is continuous with the opening 31a may extend in the radial direction. Alternatively, the direction of the opening axis of the opening 31a may be a direction (the direction of a tangent line of a circular ring that defines the inner periphery of the tubular member 3) along the circumferential direction of the inner peripheral surface 3a as exemplarily illustrated in FIGS. 5 and 6. In other words, part of the first through-hole 31, which is continuous with the opening 31a may extend in the circumferential direction. When the opening axis of the opening 31a extends along the circumferential direction, gas is discharged from the opening 31a in a direction substantially aligned with the circumferential direction of the ring space and thus can be efficiently supplied along the ring space. Accordingly, the gas tends to flow along the ring space in the circumferential direction.

Thus, a lower gas supplying pressure is needed to flow the gas along the entire circumference of the ring space.

In the example illustrated in FIGS. 2, 3, 5, and 6, a groove 33 is formed in the inner peripheral surface 3a of the tubular member 3. The groove 33 extends along the entire circumference in the circumferential direction of the inner peripheral surface 3a. The opening 31a of the first through-hole 31 is formed in the groove 33. For example, the opening 31a is formed in a bottom surface (surface extending in the Z direction) of the groove 33. With this configuration, the ring space is sandwiched by the groove 33 in the Z direction so that gas is likely to flow in the circumferential direction. In addition, the configuration leads to increase in the volume of the ring space, thereby increasing the amount of gas flowing in the ring space.

Sealed Space

The substrate processing device 10 may include a sealed space. In the example illustrated in FIGS. 2 and 3, the ultraviolet irradiator 2, the tubular member 3, a partition 5, and a floor 51 are coupled with each other to form a sealed space. The ultraviolet irradiator 2 has a protrusion shape toward the tubular member 3 at a peripheral part of a lower surface thereof. This protrusion is coupled with an outer peripheral part of the upper surface 3c of the tubular member 3. The openings 321a and 322a of the second through-holes 321 and 322 are disposed at an inner peripheral part of the upper surface 3c, and face to the lower surface of the ultraviolet irradiator 2 in the Z direction through a void space. The partition 5 is coupled with the lower surface 3d of the tubular member 3. The partition 5 extends in the Z direction and is coupled with the floor 51.

The substrate holding table 1 and the movement mechanism 12 are housed in the sealed space formed by the ultraviolet irradiator 2, the tubular member 3, the partition 5, and the floor 51.

Gas Exhaust

The partition 5 includes a gas exhaust through-hole 52. The through-hole 52 is coupled with the gas exhaust unit 61. The gas exhaust unit 61 includes, for example, a pipe 611 coupled with the through-hole 52. Air in the substrate processing device 10 is externally exhausted through the pipe 611.

Shutter

The partition 5 includes a shutter (not illustrated) functioning as a port through which the substrate W1 is conveyed. When the shutter is opened, the inside and outside of the substrate processing device 10 are communicated with each other. The indexer robot 121 or the conveyance robot 123 can take the substrate W1 into or out of the substrate processing device 10 through the shutter being opened. When the substrate processing device 10 is provided to the passing unit 122, a shutter for the indexer robot 121 and a shutter for the conveyance robot 123 are provided.

Controller

A controller 7 controls the ultraviolet irradiator 2, the movement mechanism 12, the on-off valve 412 of the first gas supplying unit 41, the on-off valve 422 of the second gas supplying unit 42, and the shutter.

The controller 7 is an electronic circuit instrument and may include, for example, a data processing device and a storage medium. The data processing device may be, for example, an arithmetic processing device such as a central processor unit (CPU). The storage unit may include a non-transitory storage medium (for example, a read only memory (ROM) or a hard disk) and a transitory storage medium (for example, a random access memory (RAM)). The non-transitory storage medium may store, for example, a computer program that defines processing executed by the controller 7. The processing defined by the computer program can be executed by the controller 7 through the processing device executing the computer program. Alternatively, part or all of the processing executed by the controller 7 may be executed by hardware.

Operation of Substrate Processing Device

Figure 7:
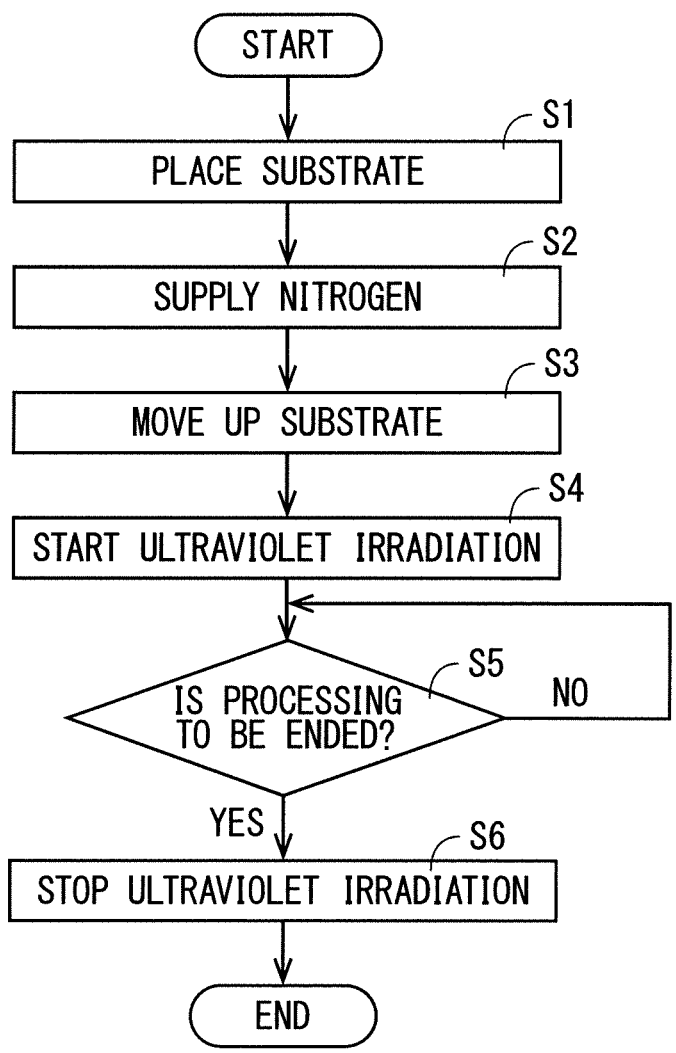
FIG. 7 is a flowchart illustrating an exemplary operation of the substrate processing device.

FIG. 7 is a flowchart illustrating an exemplary operation of the substrate processing device 10. The movement mechanism 12 is initially stopping the substrate holding table 1 at the second position (FIG. 2). In this example, gas is constantly exhausted by the gas exhaust unit 61. At step S1, the controller 7 opens the shutter, controls the indexer robot 121 or the conveyance robot 123 to place the substrate W1 on the substrate holding table 1, and then closes the shutter. Subsequently at step S2, the controller 7 controls, for example, the first gas supplying unit 41 (the on-off valve 412, in particular) and the second gas supplying unit 42 (the on-off valve 422, in particular) to start gas supply. Accordingly, gas is discharged through the openings 31a, 321a, and 322a. The gas is, for example, nitrogen. Steps S1 and S2 may be executed in the opposite order or in parallel.

Subsequently at step S3, the controller 7 controls the movement mechanism 12 to move the substrate holding table 1 closer to the ultraviolet irradiator 2 and stop the substrate holding table 1 at the first position. At the first position, the distance between the substrate W1 and the ultraviolet irradiator 2 is, for example, several millimeters to several tens millimeters approximately. More specifically, the distance is, for example, 2 mm.

Subsequently at step S4, the controller 7 controls the ultraviolet irradiator 2 to emit ultraviolet light. The controller 7 may execute step S3 when a predetermined atmosphere is achieved in the active space H1. For example, the controller 7 measures an elapsed time since step S2. The elapsed time is measured by a measurement circuit such as a timer circuit. The controller 7 may determine whether the elapsed time is longer than a predetermined reference value and may execute step S3 when the determination is positive. Alternatively, the atmosphere in the active space H1 may be measured, and the controller 7 may determine whether the predetermined atmosphere is achieved in the active space H1 based on this measured value.

The irradiation with ultraviolet light by the ultraviolet irradiator 2 provides the substrate W1 with processing using ultraviolet light. For example, the irradiation of the substrate W1 with ultraviolet light removes electric charge from the substrate W1. This is thought to be because photoelectric effect occurs to the substrate W1. The wavelength of ultraviolet light is, for example, less than or equal to 252 nm. In this wavelength range, electric charge can be effectively removed from the substrate W1. Wavelengths in 172±20 nm more effectively achieve the removal.

Subsequently at step S5, the controller 7 determines whether to end processing on the substrate W1. For example, when an elapsed time since step S4 exceeds a predetermined time, the controller 7 may determine that the processing is to be ended. Alternatively, for example, electric charge at the substrate W1 may be measured, and the determination may be performed based on the measured value. When having determined that the processing on the substrate W1 is not to be ended, the controller 7 executes step S5 again. When having determined that the processing is to be ended, at step S6, the controller 7 causes the ultraviolet irradiator 2 to stop the ultraviolet irradiation. Accordingly, the processing using ultraviolet light (for example, processing to remove electric charge) ends. In the substrate processing device 10, the inner peripheral surface 3a of the tubular member 3 and the side surface 1b of the substrate holding table 1 form the ring space when the substrate holding table 1 stops at the first position at step S3. Since the first gas supplying unit 41 has started gas supply at step S2 preceding step S3, the ring space is supplied with gas. Since the second gas supplying unit 42 has started gas supply at step S2, the active space H1 is supplied with gas. The active space H1 is communicated with the ring space, so that the gas in the active space H1 flows into the non-active space H2 through the ring space.

In the active space H1, local negative pressure occurs due to gas interaction. In this case, gas flows from the ring space to the active space H1. Since the ring space is supplied with gas from the first gas supplying unit 41, the gas flowing into the active space H1 is mainly the gas from the first gas supplying unit 41. Simultaneously, air from the non-active space H2 is unlikely to flow into the active space H1 because of the gas in the ring space acting as a barrier.

In a comparative example, the tubular member 3 does not include the first through-hole 31. In this case, when local negative pressure occurs in the active space H1, air in the non-active space H2 flows into the active space H1 through the ring space. Since the air in the non-active space H2 is different from the predetermined atmosphere, this flow deviates the atmosphere in the active space H1 from the predetermined atmosphere. For example, when nitrogen is supplied into the active space H1 by the second gas supplying unit 42 to reduce the concentration of oxygen in the active space H1, the oxygen in the non-active space H2 flows into the active space H1, and the concentration of oxygen in the active space H1 increases accordingly. This leads to a longer time taken for reducing the concentration of oxygen.

However, in the substrate processing device 10, the ring space is supplied with gas from the first gas supplying unit 41. Since the gas in the ring space functions as a barrier against air from the non-active space H2, air flow from the non-active space H2 to the active space H1 can be reduced. This leads to reduction of a time taken for achieving the predetermined atmosphere in the active space H1. In other words, the predetermined atmosphere can be achieved in the active space H1 in a shorter time. Thus, the throughput of substrate processing can be improved.

In the example illustrated in FIGS. 5 and 6, the opening 31a faces in the circumferential direction of the inner peripheral surface 3a. With this configuration, gas is likely to flow along the ring space and fill through the entire circumference of the ring space. Thus, the gas flow through the entire circumference of the ring space is likely to be achieved at a pressure lower than that for a configuration in which the opening 31a faces in the radial direction. In other words, the above-described barrier is likely to be formed across the entire circumference of the ring space.

In the above-described example, the groove 33 is provided. The groove 33 sandwiches the ring space in the Z direction so that gas is likely to flow along the ring space. This configuration also leads to increase in the volume of the ring space, thereby increasing the amount of gas contained in the ring space. Accordingly, when relatively large negative pressure locally occurs in the active space H1, a sufficient amount of gas can flow into the active space H1 from the ring space. In other words, when relatively large negative pressure occurs in the active space H1, air from the non-active space H2 is unlikely to flow into the active space H1.

Air in spaces of the grooves 11 of the substrate holding table 1 flows into the active space H1 when local negative pressure occurs in the active space H1. Thus, it is not preferable that atmosphere in the spaces is different from the predetermined atmosphere.

In the above-described example, the controller 7 executes step S3 after executing step S2. Specifically, the controller 7 moves the substrate holding table 1 after starting gas supply. Accordingly, gas is supplied through the opening 31a of the inner peripheral surface 3a of the tubular member 3 while the substrate holding table 1 is moving. Thus, when the grooves 11 become close to the opening 31a in the Z direction during the movement, the gas from the opening 31a flows into the grooves 11 of the substrate holding table 1. As a result, at least part of air in the grooves 11 is replaced with the gas supplied from the opening 31a. In this manner, an atmosphere closer to the predetermined atmosphere can be achieved in the spaces of the grooves 11. Accordingly, any gas flowing into the active space H1 from the spaces of the grooves 11 is unlikely to deviate the atmosphere in the active space H1 from the predetermined atmosphere. Thus, the predetermined atmosphere can be achieved in the active space H1 in a time shorter than that taken in a case in which step S2 is executed between steps S3 and S4.

Gas is likely to flow inside the grooves 11 in the configuration in which the grooves 11 extend from part of the periphery of the upper surface 1a of the substrate holding table 1 to another part of the periphery, in other words, the grooves 11 are each opened at both ends in a horizontal direction (for example, the Y direction). Thus, an atmosphere closer to the predetermined atmosphere is further likely to be achieved in the grooves 11.

In the above-described example, the tubular member 3 includes the second through-holes 321 and 322, which function as gas supply paths for the active space H1. In other words, the gas supply paths are provided at sides of the substrate holding table 1. This is preferable for the substrate processing device 10 in which the ultraviolet irradiator 2 is disposed above the substrate W1. Specifically, when the second gas supplying unit 42 is disposed above the substrate W1, the ultraviolet irradiator 2 and the second gas supplying unit 42 need to be disposed so that interference therebetween is avoided. However, when the tubular member 3 includes the second through-holes 321 and 322, the second gas supplying unit 42 does not need to be disposed above the substrate W1, which leads to improved freedom in the shapes of the ultraviolet irradiator 2 and the second gas supplying unit 42.

First Through-Hole

Arrangement in Circumferential Direction

Figure 8:
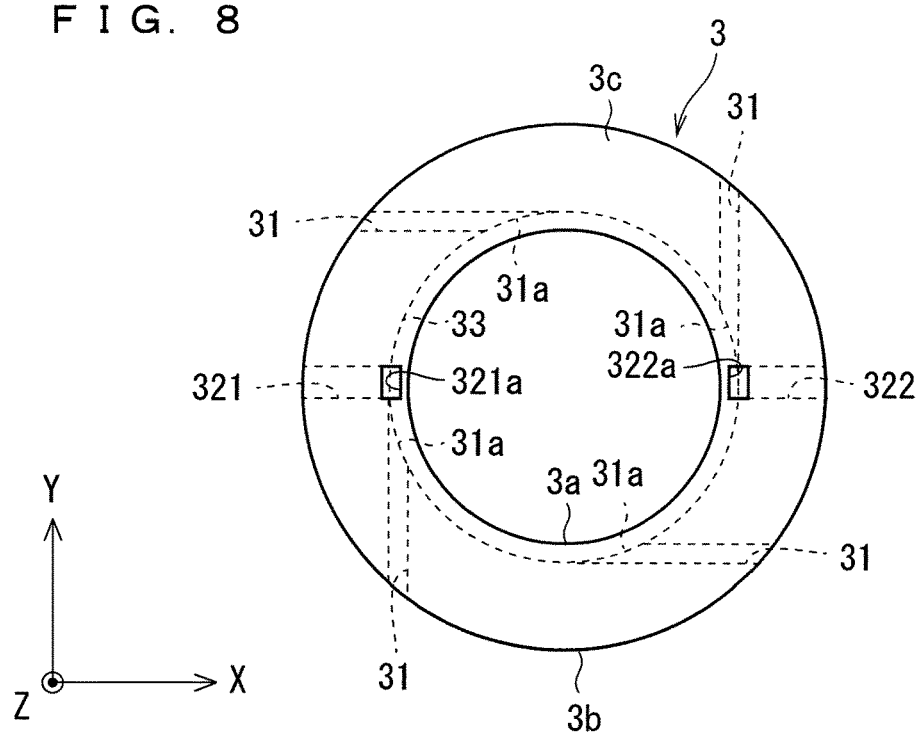
FIG. 8 is a diagram schematically illustrating another exemplary configuration of the tubular member.

A plurality of openings may be provided to the inner peripheral surface 3a of the tubular member 3. FIG. 8 is a top view schematically illustrating an exemplary configuration of the tubular member 3. The tubular member 3 includes a plurality of first through-holes 31. Each of the plurality of first through-holes 31 has one end (the opening 31a) opened at the inner peripheral surface 3a. The plurality of openings 31a are arranged at intervals in the circumferential direction. For example, the plurality of openings 31a are disposed at equal intervals in the circumferential direction. The plurality of openings 31a are all provided in the groove 33.

Each of the plurality of first through-holes 31 has the other end opened at the outer peripheral surface 3b. The other end is connected with the first gas supplying unit 41. The first gas supplying unit 41 supplies gas to the ring space through the plurality of first through-holes 31. With this configuration, the gas is supplied to the ring space from a plurality of positions in the circumferential direction.

The plurality of openings 31a all face in an identical direction (for example, a clockwise direction) along the circumferential direction of the inner peripheral surface 3a. With this configuration, gas is likely to flow through the entire circumference of the ring space. In a generalized expression, the opening axis of each opening is aligned with one of clockwise and anticlockwise directions along the circumferential direction. The clockwise and anticlockwise directions are relatively defined, and thus may be defined when viewed from the positive side of the Z axis or when viewed from the negative side of the Z axis.

Pressure is highest right after the opening 31a and decreases further away from the opening 31a. When the plurality of openings 31a facing in the same direction are disposed at positions different from each other in the circumferential direction, pressure is high at different positions in the circumferential direction. This configuration achieves overall uniform pressure distribution. When the pressure of gas in the ring space locally decreases, air in the non-active space H2 is likely to flow into the active space H1 through this local part. The uniform pressure distribution of gas in the ring space leads to reduction of the flow of air from the non-active space H2 into the active space H1 irrespective of a position in the circumferential direction.

In the example illustrated in FIG. 8, the other ends of the plurality of first through-holes 31 are opened at positions different from each other on the outer peripheral surface 3b, but may be opened at an identical position. Specifically, a plurality of holes may be bifurcated from a hole continuous with one opening at the outer peripheral surface 3b and may be opened at positions different from each other on the inner peripheral surface 3a. This configuration applies to any other through-hole to be described later.

Arrangement in Z Direction

Figure 9:
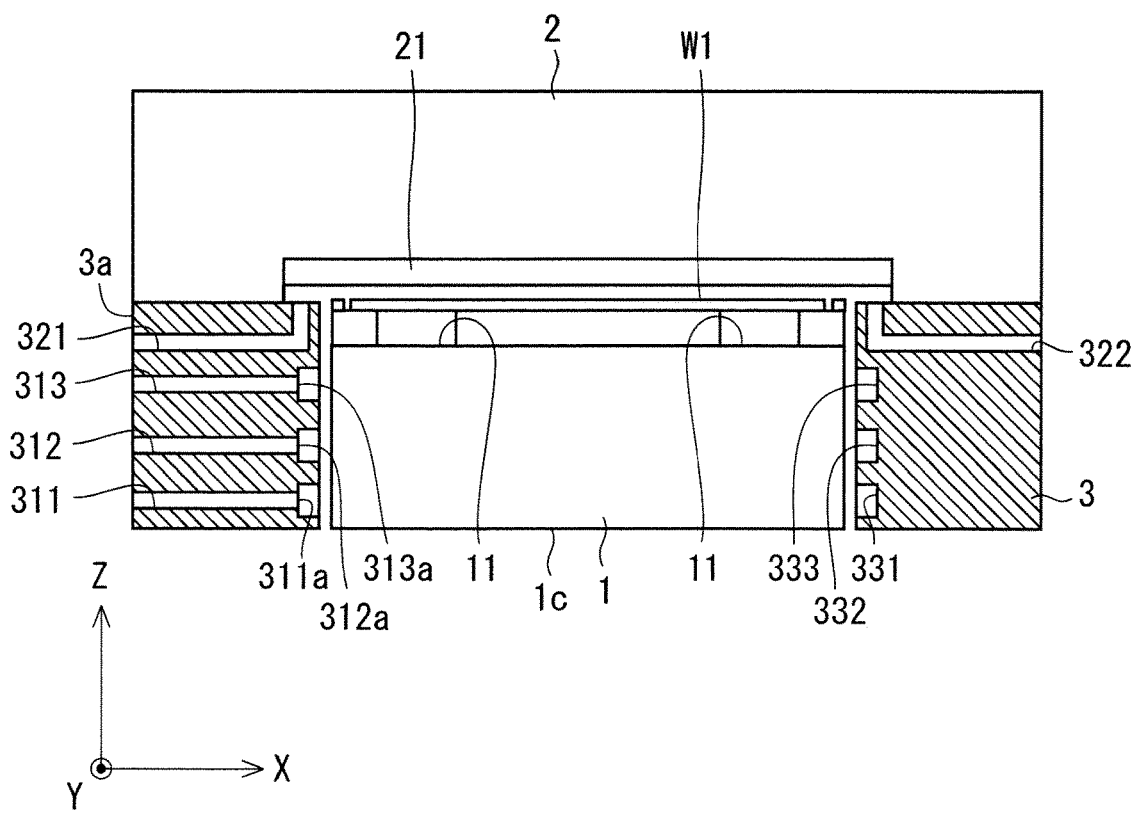
FIG. 9 is a diagram schematically illustrating an exemplary configuration of the tubular member.

The openings at the inner peripheral surface 3a of the tubular member 3 may be disposed at positions different from each other in the Z direction. FIG. 9 is a diagram schematically illustrating an exemplary configuration of the tubular member 3. FIG. 9 also illustrates the ultraviolet irradiator 2 and the substrate holding table 1 while the substrate holding table 1 is stopped at the first position.

For example, the tubular member 3 includes a plurality of first through-holes 311 to 313. Each of the first through-holes 311 to 313 has one end opened at the inner peripheral surface 3a. Hereinafter, the opened ends of the first through-holes 311 to 313 are also referred to as openings 311a to 313a. The openings 311a to 313a are disposed at positions different from each other in the Z direction. For example, the openings 311a to 313a may be positioned at equal intervals in the Z direction.

While the substrate holding table 1 is stopped at the first position (FIG. 9), the openings 311a to 313a are all positioned between the bottom surfaces of the grooves 11 of the substrate holding table 1 and the lower surface 1c of the substrate holding table 1 in the Z direction. With this configuration, the grooves 11 are not disposed in XY planes passing through the respective openings 311a to 313a so that the inner peripheral surface 3a of the tubular member 3 and the side surface 1b of the substrate holding table 1 form the ring space.

Each of the first through-holes 311 to 313 has the other end opened at the outer peripheral surface 3b of the tubular member 3. The other end is connected with the first gas supplying unit 41. The first gas supplying unit 41 supplies gas to the ring space through the first through-holes 311 to 313. Accordingly, gas is supplied to the ring space from a plurality of positions in the Z direction. Thus, gas can flow into the ring space through multiple layers. Hereinafter, the first through-holes 311, 312, and 313 are also referred to as a first-layer through-hole 311, a second-layer through-hole 312, and a third-layer through-hole 313, respectively.

In the example illustrated in FIG. 9, the openings 311a to 313a at the respective layers face in the radial direction, but may face in the circumferential direction of the inner peripheral surface 3a. With this configuration, gas from the openings 311a to 313a can be supplied along the ring space. Accordingly, the gas is likely to flow through the entire circumference of the ring space at each layer. The openings 311a to 313a may all face in an identical direction (for example, a clockwise direction) along the circumferential direction of the inner peripheral surface 3a. Thus, the openings 311a to 313a disposed at different positions in the Z direction may all face in an identical direction.

With this configuration, gas at each layer flows in the identical direction. Consider a comparative example in which an opening 312a faces in a direction opposite to that of the openings 311a and 313a. In this case, gas at the layers interact with each other, encumbering flow in the circumferential direction at the layers. As a result, for example, the gas potentially flows up to halfway through the ring space at each layer. This leads to degradation of the functionality of the gas as a barrier. When gas at each layer flows in an identical direction, however, the gas is likely to flow through the entire circumference of the ring space at each layer, thereby achieving improvement of the function as a barrier.

In the example illustrated in FIG. 9, a plurality of grooves 331 to 333 are provided to the inner peripheral surface 3a of the tubular member 3. The plurality of grooves 331 to 333 are disposed at positions different from each other in the Z direction.

Hereinafter, the grooves 331 to 333 are also referred to as a first-layer groove 331, a second-layer groove 332, and a third-layer groove 333, respectively. The grooves 331 to 333 each extend through the entire circumference of the inner peripheral surface 3a in the circumferential direction. The openings 311a to 313a are provided inside the respective grooves 331 to 333. For example, the openings 311a to 313a are provided on the bottom surfaces (surfaces along the Z direction) of the respective grooves 331 to 333.

With this configuration, gas discharged from the opening 311a mainly flows through the first-layer groove 331, gas discharged from the opening 312a mainly flows through the second-layer groove 332, and gas discharged from the opening 313a mainly flows through the third-layer groove 333. Accordingly, gas flow is likely to be formed in layers.

Figure 10:
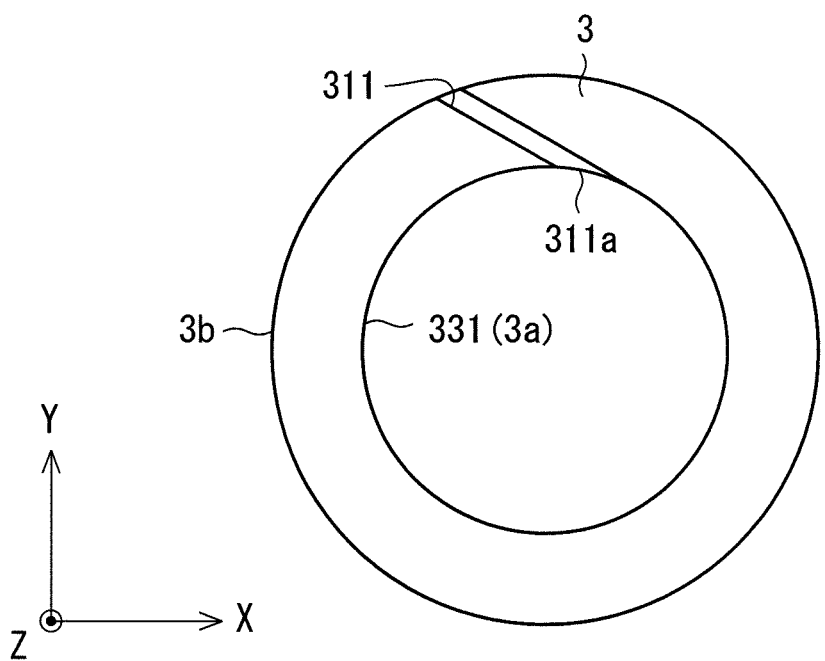
FIG. 10 is a diagram schematically illustrating an exemplary configuration of the tubular member.
Figure 11:
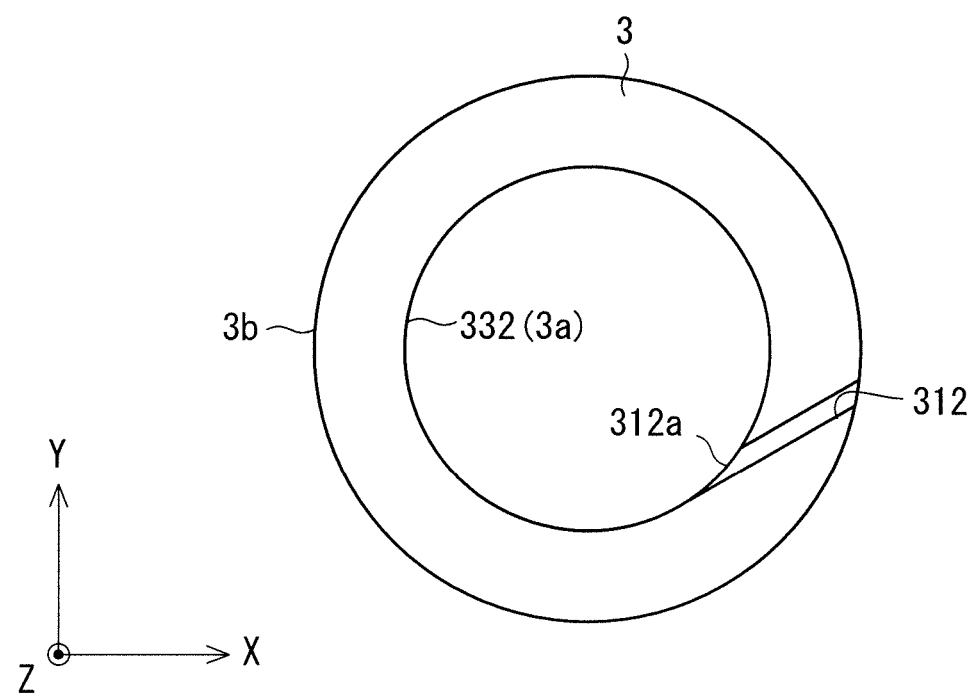
FIG. 11 is a diagram schematically illustrating an exemplary configuration of the tubular member.
Figure 12:
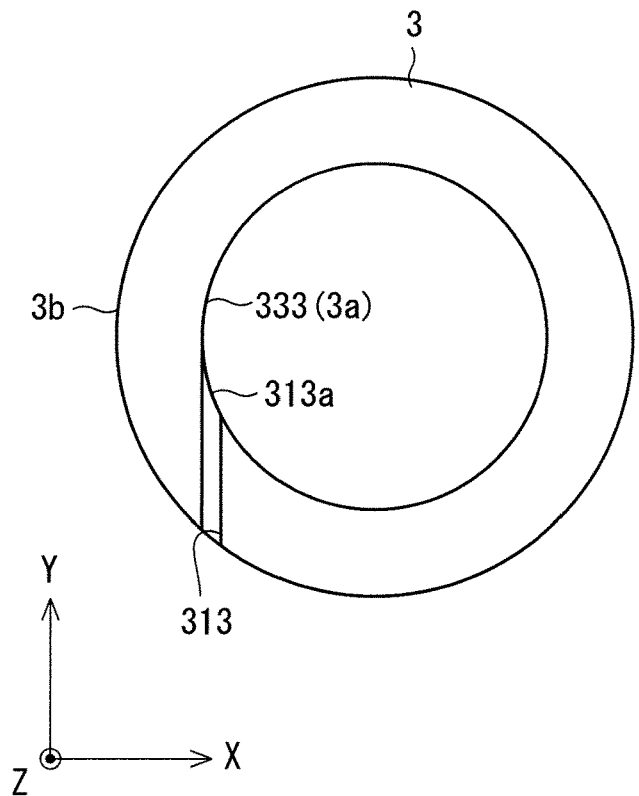
FIG. 12 is a diagram schematically illustrating an exemplary configuration of the tubular member.

The positions of the openings 311a to 313a in the circumferential direction may differ from each other. For example, the openings 311a to 313a may be disposed at equal intervals in the circumferential direction. FIGS. 10 to 12 are diagrams schematically illustrating exemplary configurations of the tubular member 3 at XY planes passing through the respective openings 311a to 313a. The second-layer opening 312a (FIG. 11) is disposed at a position to which the first-layer opening 311a (FIG. 10) is rotated by 120° in a clockwise direction about the central axis of the inner peripheral surface 3a, and the third-layer opening 313a (FIG. 12) is disposed at a position to which the second-layer opening 312a is rotated by 120° in the same direction. In other words, the openings 311a to 313a are positioned at equal intervals in the circumferential direction when viewed in the Z direction.

Pressure is highest right after the openings 311a to 313a and decreases further away from the openings 311a to 313a. When the openings 311a to 313a facing in the same direction are disposed at positions different from each other in the circumferential direction, pressure is high at positions different from each other between the layers (grooves 331 to 333) in the circumferential direction. This configuration achieves overall uniform pressure distribution.

Circumferential Direction and Z Direction

A plurality of openings may be provided at each layer. For example, a plurality of openings (also referred to as first-layer openings) 311a of the first-layer through-holes 311 may be provided at a first-layer position in the Z direction, a plurality of openings (also referred to as second-layer openings) 312a of the second-layer through-holes 312 may be provided at a second-layer position in the Z direction, and a plurality of openings (also referred to as third-layer openings) 313a of the third-layer through-holes 313 may be provided at a third-layer position in the Z direction.

Figure 13:
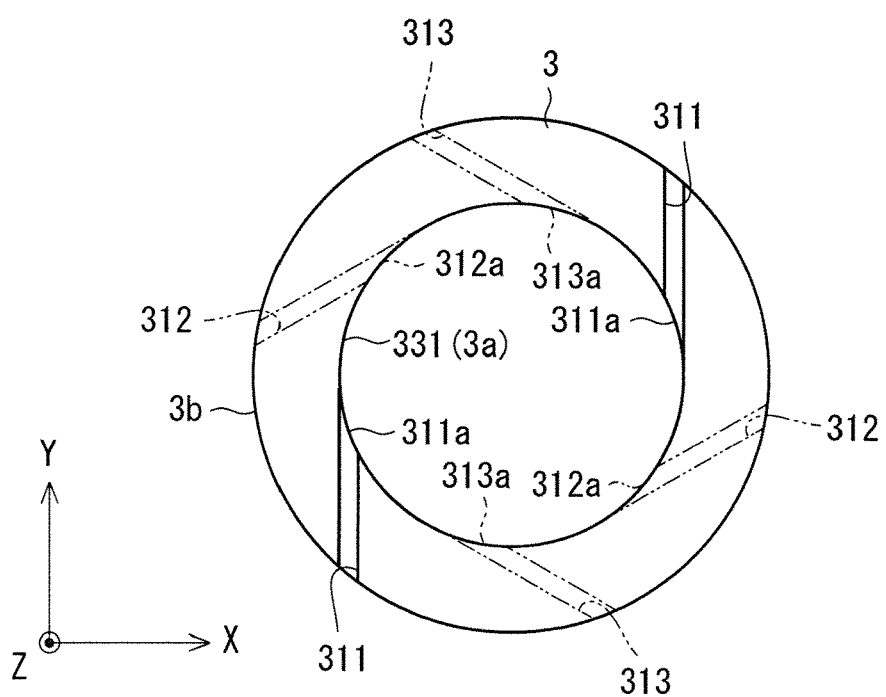
FIG. 13 is a diagram schematically illustrating an exemplary configuration of the tubular member.

FIG. 13 is a diagram schematically illustrating exemplary first through-holes disposed at each layer in the tubular member 3. FIG. 13 illustrates two of the first-layer through-holes 311, two of the second-layer through-holes 312, and two of the third-layer through-holes 313. Virtual lines are used to indicate that the second-layer through-holes 312 and the third-layer through-holes 313 are disposed at positions different from those of the first-layer through-holes 311 in the Z direction.

The two openings 311a, the two openings 312a, and the two openings 313a face in an identical direction (for example, a clockwise direction) along the circumferential direction. In a generalized expression, the opening axis of each opening at a plurality of layers is aligned with one of clockwise and anticlockwise directions along the circumferential direction. The openings 311a to 313a may be disposed at positions different from each other in the circumferential direction. For example, openings at each layer may be disposed at equal intervals in the circumferential direction such that all openings at all layers are disposed at equal intervals in the circumferential direction. For example, the two first-layer openings 311a are disposed at positions facing to each other with respect to the central axis of the tubular member 3. In other words, the two first-layer openings 311a are disposed at equal intervals in the circumferential direction. The same configuration applies to the two second-layer openings 312a and the two third-layer openings 313a. The two second-layer openings 312a are disposed at positions to which the two respective first-layer openings 311a are rotated, for example, by 60° in the clockwise direction, and the two third-layer openings 313a are disposed at positions to which the two second-layer openings 312a are rotated by 60° in the clockwise direction. In this configuration, the two openings 311a, the two openings 312a, and the two openings 313a are all disposed at equal intervals in the circumferential direction.

Each of the first-layer through-holes 311, the second-layer through-hole 312, and the third-layer through-hole 313 has the other end opened at the outer peripheral surface 3b of the tubular member 3. The other end is connected with the first gas supplying unit 41.

As described above, when openings facing in the same direction at each layer are disposed side by side in the circumferential direction, uniform pressure distribution can be achieved in the ring space at the layer. When the openings at all layers are disposed at positions different from each other in the circumferential direction, overall uniform pressure distribution can be achieved in the ring space. To even slightly contribute to the overall uniform pressure distribution, at least one of the openings at a certain layer needs to be disposed at a position different from that of at least one of the openings at another layer in the circumferential direction. In other words, openings belonging to different layers may be disposed at an identical position in the circumferential direction.

Rotation Mechanism

Figure 14:
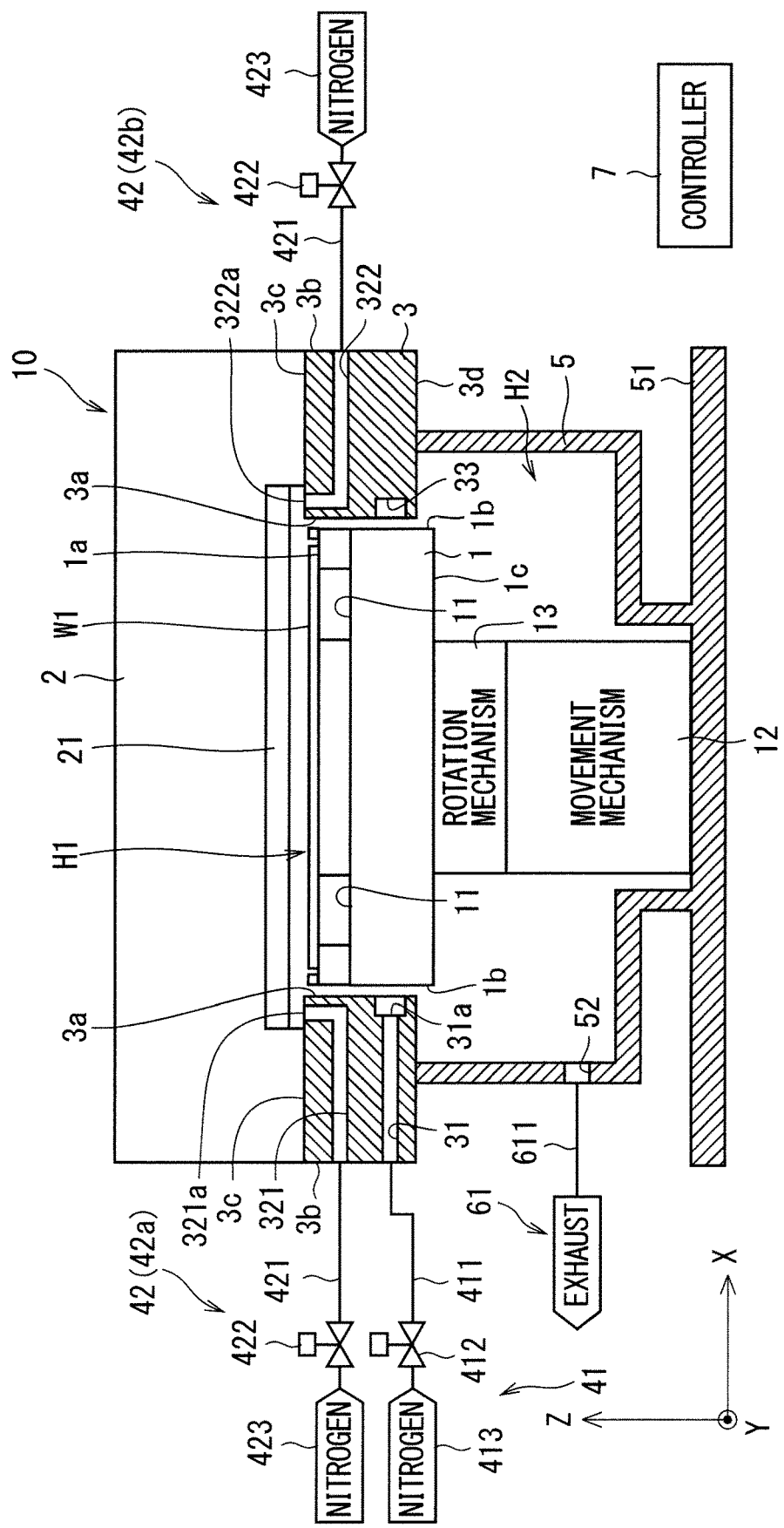
FIG. 14 is a diagram schematically illustrating an exemplary configuration of the substrate processing device.

FIG. 14 is a diagram schematically illustrating another exemplary configuration of the substrate processing device 10. The substrate processing device 10 illustrated in FIG. 14 differs from the substrate processing device 10 illustrated in FIGS. 2 and 3 in that a rotation mechanism 13 is provided. The rotation mechanism 13 rotates the substrate holding table 1 to rotate the substrate W1. The rotation mechanism 13 has, for example, a rotational axis passing through the center of the substrate W1 and vertical to the main surface of the substrate W1. The rotation mechanism 13 includes, for example, a motor. The rotation mechanism 13 is controlled by the controller 7.

The rotation mechanism 13 rotates the substrate holding table 1 to rotate the substrate W1, for example, during ultraviolet irradiation by the ultraviolet irradiator 2. In this manner, the substrate W1 can be uniformly irradiated with ultraviolet light.

When the opening 31a faces in the circumferential direction, the rotation mechanism 13 preferably rotates the substrate holding table 1 in a direction same as the opening direction (for example, a clockwise direction) of the opening 31a. With this configuration, gas flow in the ring space is unlikely to be disturbed as compared to a case in which the rotation mechanism 13 rotates the substrate holding table 1 in the opposite direction. Accordingly, the functionality of the gas in the ring space as a barrier can be improved as compared to the case in which the substrate holding table 1 is rotated oppositely to the opening direction of the opening 31a.

Substrate Holding Table

Figure 15:
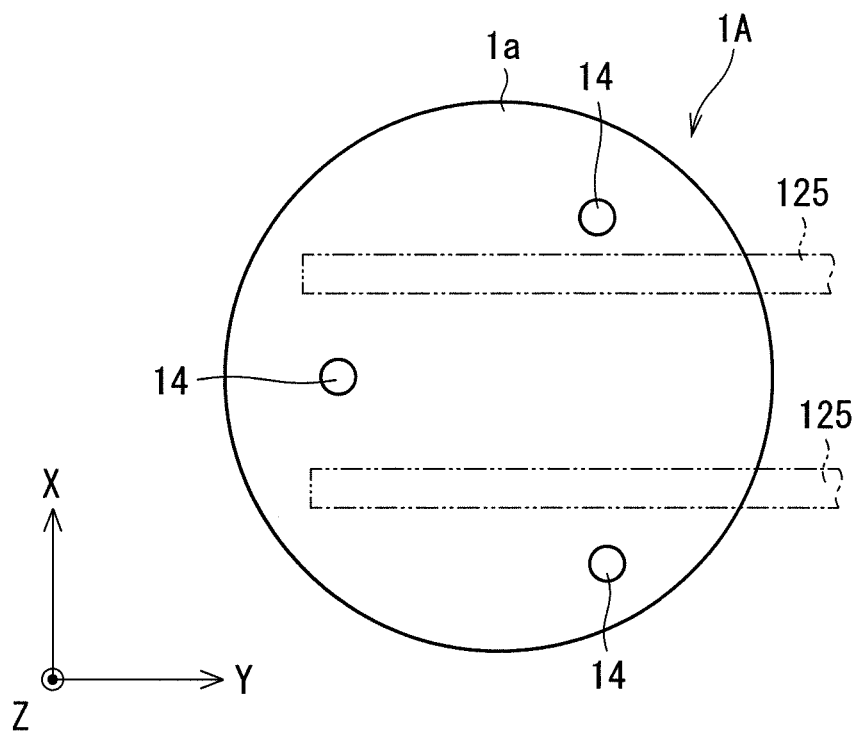
FIG. 15 is a diagram illustrating another exemplary configuration of the substrate holding table.
Figure 16:
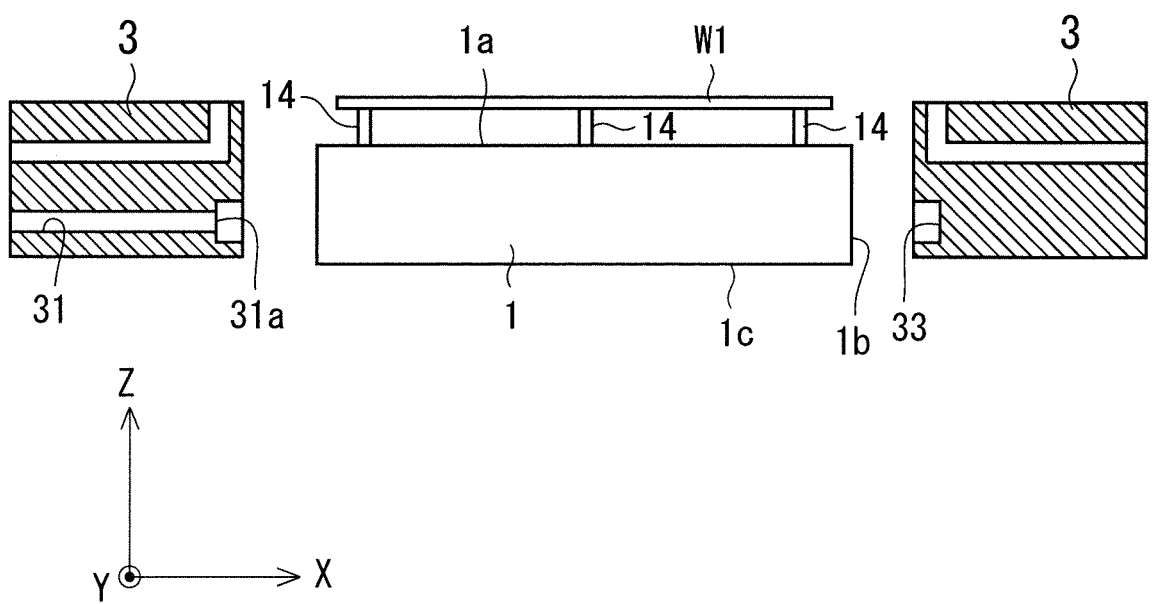
FIG. 16 is a diagram illustrating another exemplary configuration of the substrate holding table.

In the example illustrated in FIGS. 2 to 4, the pair of grooves 11 are provided to the substrate holding table 1. However, the pair of grooves 11 are not necessarily needed. FIGS. 15 and 16 are each a diagram schematically illustrating a substrate holding table 1A as another example of the substrate holding table 1. FIG. 15 illustrates the substrate holding table 1A when viewed from the ultraviolet irradiator 2, and FIG. 16 illustrates the substrate holding table 1A when viewed in the horizontal direction. FIG. 16 also illustrates the tubular member 3 while the substrate holding table 1A is stopped at the first position.

A plurality of protrusions 14 are provided to the upper surface 1a of the substrate holding table 1A in place of the grooves 11. The plurality of protrusions 14 each have a column shape (for example, a cylindrical shape). The plurality of protrusions 14 are disposed at such positions that interference with the hands 125 of the indexer robot 121 and the conveyance robot 123 is avoided. In the example illustrated in FIGS. 15 and 16, three protrusions 14 are provided at respective apexes of a virtual triangle. The height (height in the Z direction) of each protrusion 14 is larger than the thickness (thickness in the Z direction) of each hand 125. The substrate W1 is supported by leading ends of the plurality of protrusions 14.

When the substrate holding table 1A is used, the opening 31a of the tubular member 3 is positioned between the upper surface 1a (part at which the protrusions 14 are not provided) and the lower surface 1c of the substrate holding table 1A in the Z direction while the substrate holding table 1A is stopped at the first position (FIG. 16). With this configuration, the protrusions 14 are not disposed at an XY plane passing through the opening 31a so that the inner peripheral surface 3a of the tubular member 3 and the side surface 1b of the substrate holding table 1A form the ring space.

The above-described effect due to gas supply from the opening 31a can be achieved by using the substrate holding table 1 thus configured. However, when the substrate holding table 1 illustrated in FIG. 4 is used, the volume of a space between the substrate holding table 1 and the substrate W1 can be reduced as compared to the substrate holding table 1A. This space is initially filled with air different from the predetermined atmosphere, and thus it is not preferable that air flows into the active space H1 from the space. For this reason, the substrate holding table 1, which achieves the reduced volume of the space, is preferable.

Figure 17:
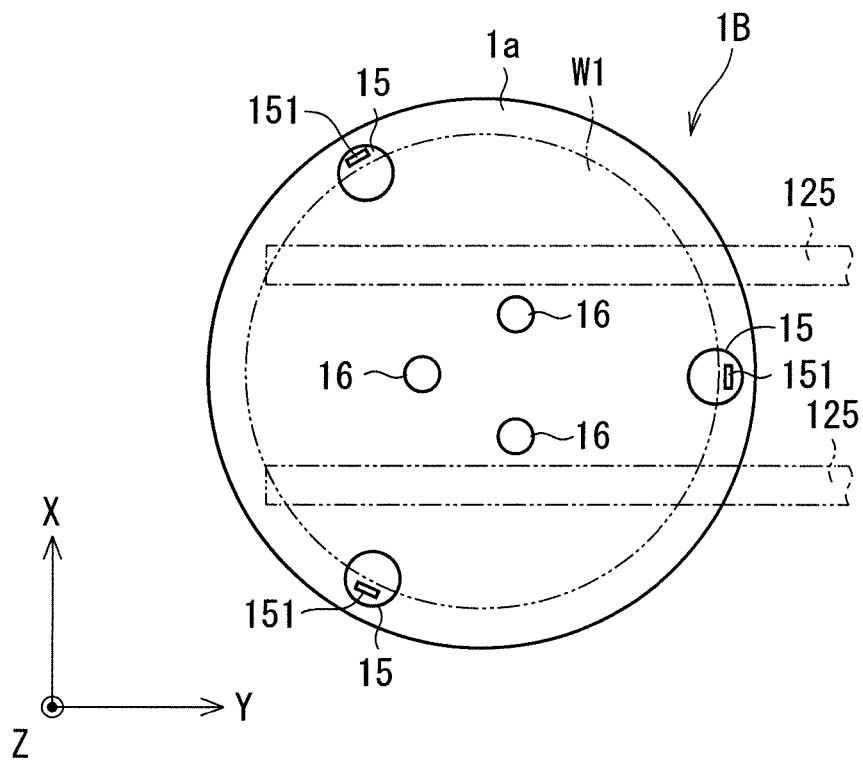
FIG. 17 is a diagram illustrating another exemplary configuration of the substrate holding table.
Figure 18:
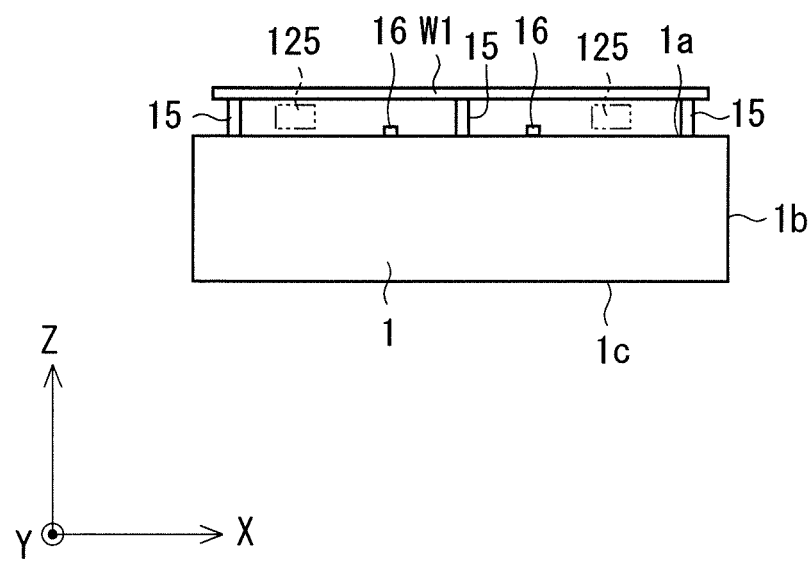
FIG. 18 is a diagram illustrating another exemplary configuration of the substrate holding table.
Figure 19:
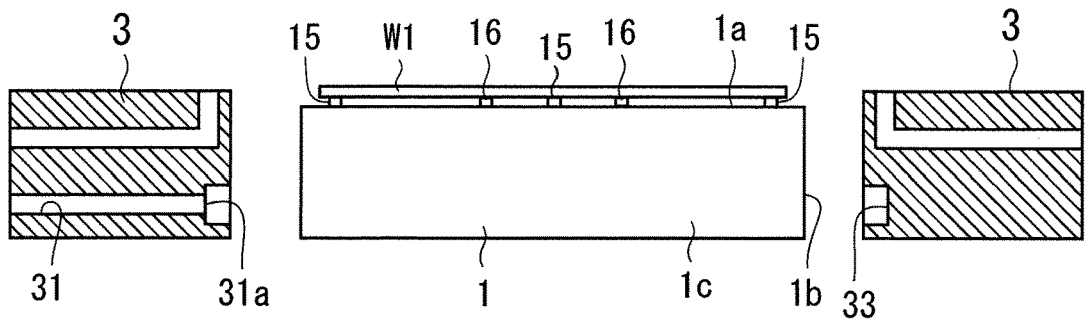
FIG. 19 is a diagram illustrating another exemplary configuration of the substrate holding table.

FIGS. 17 to 19 are each a diagram schematically illustrating the configuration of a substrate holding table 1B as another example of the substrate holding table 1. FIG. 17 illustrates the substrate holding table 1B when viewed from the ultraviolet irradiator 2, and FIGS. 18 and 19 illustrate the substrate holding table 1B when viewed in the horizontal direction. FIG. 19 also illustrates the tubular member 3 while the substrate holding table 1B is stopped at the first position.

A plurality of elevation protrusions 15 and a plurality of fixed protrusions 16 are provided to the upper surface 1a of the substrate holding table 1B in place of the grooves 11. The plurality of elevation protrusions 15 and the plurality of fixed protrusions 16 are disposed so that interference with the hands 125 of the indexer robot 121 and the conveyance robot 123 is avoided. For example, the plurality of elevation protrusions 15 are disposed at equal intervals in the circumferential direction near the periphery of the upper surface 1a. In the example illustrated in FIG. 17, three elevation protrusions 15 are provided. The elevation protrusions 15 each have a column shape (for example, a cylindrical shape). The substrate W1 is placed at leading ends of the elevation protrusions 15.

The elevation protrusions 15 can be elevated and lowered in the Z direction. Thus, the amount of protrusion (height in the Z direction) of the elevation protrusions 15 can be varied. The elevation protrusions 15 may be what is called lift pins that can be elevated and lowered. The degree of elevation (the amount of protrusion) of the elevation protrusions 15 is controlled by the controller 7. For example, the elevation protrusions 15 can be moved in the Z direction. For example, a cylinder may be used for such a movement mechanism. The amount of protrusion of the elevation protrusions 15 increases as the elevation protrusions 15 move closer to the ultraviolet irradiator 2 (FIG. 18). In other words, the heights of the elevation protrusions 15 increase. The amount of protrusion of the elevation protrusions 15 decreases as the elevation protrusions 15 move further away from the ultraviolet irradiator 2 (FIG. 19). In other words, the heights of the elevation protrusions 15 decrease.

The plurality of fixed protrusions 16 are disposed at positions different from those of the plurality of the elevation protrusions 15, and for example, are provided closer to the center of the upper surface 1a than any of the plurality of the elevation protrusions 15. The plurality of fixed protrusions 16 are positioned at equal intervals in the circumferential direction. In the example illustrated in FIG. 17, three fixed protrusions 16 are provided at equal intervals in the circumferential direction. Each fixed protrusion 16 has a column shape (for example, a cylindrical shape) and has a height in the Z direction smaller than, for example, the thicknesses of the hands 125 of the indexer robot 121 and the conveyance robot 123 in the Z direction. The height of the fixed protrusion 16 is set to be, for example, 0.5 mm approximately.

When the substrate holding table 1B is used, the opening 31a of the tubular member 3 is positioned between the upper surface 1a (part at which the elevation protrusions 15 and the fixed protrusions 16 are not provided) and the lower surface 1c of the substrate holding table 1B in the Z direction while the substrate holding table 1B is stopped at the first position (FIG. 19). With this configuration, the elevation protrusions 15 and the fixed protrusions 16 are not disposed at an XY plane passing through the opening 31a so that the inner peripheral surface 3a of the tubular member 3 and the side surface 1b of the substrate holding table 1 form the ring space.

Figure 20:
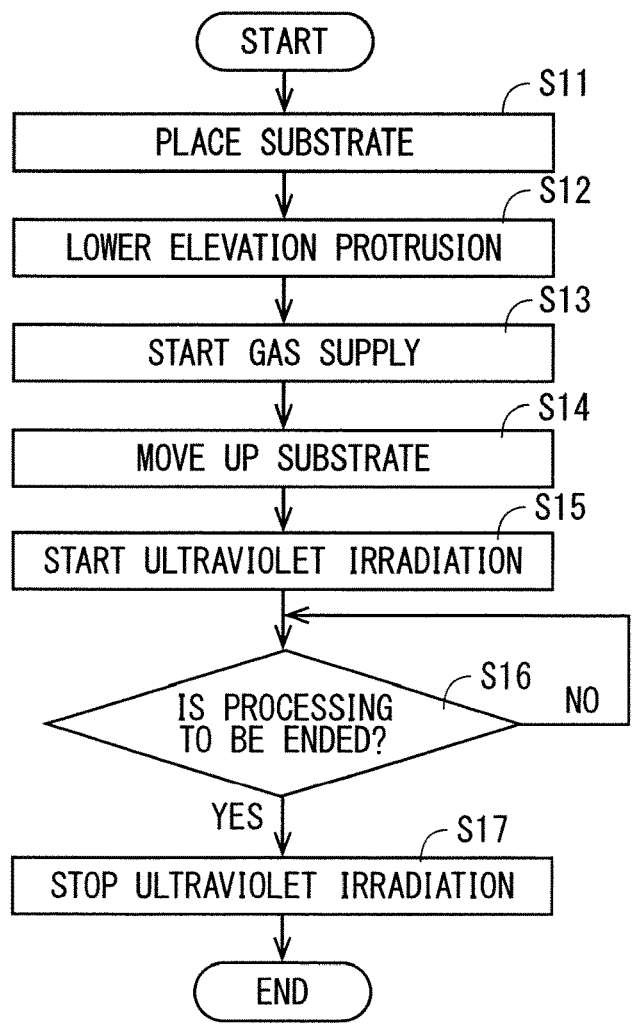
FIG. 20 is a flowchart illustrating an exemplary operation of the substrate processing device.

FIG. 20 is a flowchart illustrating an exemplary operation of the substrate processing device 10. The heights (amount of protrusion) of the elevation protrusions 15 are initially larger than the thicknesses of the hands 125 of the indexer robot 121 and the conveyance robot 123. At step S11, the controller 7 opens the shutter and controls the indexer robot 121 or the conveyance robot 123 to place the substrate W1 on the plurality of the elevation protrusions 15. In this case, the hands 125 enter into a space between the substrate W1 and the substrate holding table 1B (FIG. 18). Then, the controller 7 retracts the hands 125 out of the substrate processing device 10, and then closes the shutter. In this state, the substrate W1 is supported by the plurality of the elevation protrusions 15 but is not supported by the fixed protrusions 16. In other words, when the amount of protrusion of the elevation protrusions 15 is a relatively large first value, the substrate W1 is not supported by the fixed protrusions 16 but is supported by the elevation protrusions 15. In this case, the substrate W1 is likely to deflect by own weight. The substrate W1 is supported by the plurality of the elevation protrusions 15 at the periphery thereof, and thus deflects such that a central part thereof becomes lower than the periphery.

Subsequently at step S12, the controller 7 reduces the heights (heights in the Z direction) of the elevation protrusions 15. Specifically, the controller 7 moves the elevation protrusions 15 toward a side opposite to the ultraviolet irradiator 2. The controller 7 reduces the heights of the elevation protrusions 15 until the substrate W1 becomes supported by the elevation protrusions 15 and the fixed protrusions 16. In other words, when the amount of protrusion of the elevation protrusions 15 is a second value smaller than the first value, the substrate W1 is supported by the elevation protrusions 15 and the fixed protrusions 16. Accordingly, the substrate W1 is supported at an increased number of places to reduce the deflection of the substrate W1. Specifically, the fixed protrusions 16 support the substrate W1 at places closer to the center of the substrate W1 than the elevation protrusions 15, thereby more effectively reducing the deflection of the substrate W1.

The following steps S13 to S17 are identical to steps S2 to S6, respectively. As described above, when the substrate holding table 1B is used, the deflection of the substrate W1 can be reduced to achieve a uniform distance between the main surface of the substrate W1 and the ultraviolet irradiator 2. Thus, at step S15, a uniform intensity of ultraviolet light can be obtained at the main surface of the substrate W1. Accordingly, processing can be uniformly executed on the main surface of the substrate W1.

In the above-described example, step S14 is executed after step S12. Specifically, the substrate W1 is moved closer to the ultraviolet irradiator 2 after the elevation protrusions 15 are lowered. The volume of the space between the substrate W1 and the substrate holding table 1B can be reduced by lowering the elevation protrusions 15. Thus, the substrate W1 is moved closer to the ultraviolet irradiator 2 after the volume of the space is reduced. This leads to reduction of the amount of air flow into the active space H1 from the space. This reduction contributes to reduction of a time taken for achieving the predetermined atmosphere in the active space H1.

The substrate holding table 1B includes the fixed protrusions 16. With this configuration, the mechanism of the substrate holding table 1B can be simplified as compared to a structure in which the fixed protrusions 16 are replaced with the elevation protrusions 15. This simplification leads to reduction of a manufacturing cost.

In the above-described example, the substrate W1 is supported by the elevation protrusions 15 and the fixed protrusions 16 when the elevation protrusions 15 are lowered. With this configuration, the heights of the elevation protrusions 15 may be reduced to be sufficiently lower than the heights of the fixed protrusions 16 so that the substrate W1 is held by the fixed protrusions 16 only. Alternatively, the heights of the elevation protrusions 15 may be adjusted to prevent the fixed protrusions 16 from contacting with the substrate W1 so that the substrate W1 is held by the elevation protrusions 15 only.

Third Through-Hole

FIG. 21 is a diagram schematically illustrating the configuration of a substrate holding table 1C as another example of the substrate holding table 1. The substrate holding table 1C differs from the substrate holding table 1 in that a third through-hole 18 is provided. The third through-hole 18 penetrates through the substrate holding table 1C and is communicated with a space between the substrate W1 and the substrate holding table 1C. Specifically, the third through-hole 18 has one end opened at the lower surface 1c, and the other end (conveyance groove opening) opened at the bottom surfaces of the grooves 11. The third through-hole 18 is, for example, a gas supply through-hole, and has the one end connected with a third gas supplying unit 43. The third gas supplying unit 43 supplies gas to the space between the substrate W1 and the substrate holding table 1C through the third through-hole 18. This gas is same as, for example, gas (for example, nitrogen) supplied by the first gas supplying unit 41 and the second gas supplying unit 42. The third gas supplying unit 43 includes, for example, a pipe coupled with one end of the third through-hole 18 on a side closer to the lower surface 1c, an on-off valve for controlling opening and closing of the pipe, and a gas container coupled with the pipe and containing gas.

An exemplary operation of the substrate processing device 10 is same as that illustrated in FIG. 7. However, the third gas supplying unit 43 starts gas supply at step S13. Accordingly, an atmosphere closer to the predetermined atmosphere can be achieved in the space between the substrate W1 and the substrate holding table 1C, and thus any gas flowing from this space into the active space H1 is unlikely to deviate the atmosphere in the active space H1 from the predetermined atmosphere.

The third through-hole 18 may be a gas exhaust through-hole. FIG. 22 is a diagram schematically illustrating an exemplary configuration of the substrate holding table 1C. The configuration of the substrate holding table 1C is same as that illustrated in FIG. 21, but the one end of the third through-hole 18 on the side closer to the lower surface 1c is connected with a gas exhaust unit 62. The gas exhaust unit 62 can exhaust gas in the space between the substrate W1 and the substrate holding table 1C through the third through-hole 18. The gas exhaust unit 62 includes a pipe coupled with the one end of the third through-hole 18 on the side closer to the lower surface 1c.

With this configuration, gas in the space between the substrate W1 and the substrate holding table 1C is externally exhausted through the third through-hole 18 and thus prevented from flowing into the active space H1.

Although FIGS. 21 and 22 illustrate the structure in which the third through-hole 18 is provided to the substrate holding table 1, the third through-hole 18 may be provided to the substrate holding table 1A or 1B. The third through-hole 18 only needs to be communicated with the space between the substrate W1 and the substrate holding table. In other words, the third through-hole 18 only needs to have one end (upper surface opening) opened at a position different from part of the upper surface 1a of the substrate holding table 1A or 1B, which contacts with the substrate W1. Specifically, the one end (upper surface opening) of the third through-hole 18 is opened at a position different from that of each protrusion 14 on the upper surface 1a of the substrate holding table 1A. The one end (upper surface opening) of the third through-hole 18 is opened at a position different from that of any of the elevation protrusions 15 and the fixed protrusions 16 on the upper surface 1a of the substrate holding table 1B.

Distance Between Substrate and Ultraviolet Irradiator

FIG. 23 is a flowchart illustrating an exemplary operation of the substrate processing device 10. Steps S31 and S32 are identical to steps S1 and S2, respectively. Subsequently at step S33, the controller 7 controls the movement mechanism 12 to move the substrate holding table 1 from the second position to the ultraviolet irradiator 2, and stop the substrate holding table 1 at a third position. In this manner, the substrate holding table 1 is moved closer to the ultraviolet irradiator 2. The third position is closer to the ultraviolet irradiator 2 than the first position. Thus, the substrate W1 is closer to the ultraviolet irradiator 2 when positioned at the third position than when positioned at the first position. In other words, the distance between the substrate W1 and the ultraviolet irradiator 2 at the third position is shorter than the distance between the substrate W1 and the ultraviolet irradiator 2 at the first position. For example, the distance between the substrate W1 and the ultraviolet irradiator 2 at the third position is 1 mm.

Subsequently at step S34, the controller 7 controls the movement mechanism 12 to move the substrate holding table 1 from the third position to the first position. In this manner, the substrate holding table 1 is moved further away from the ultraviolet irradiator 2. The following steps S35 to S37 are identical to steps S4 to S6, respectively.

Through this operation, the volume of the active space H1 between the substrate W1 and the ultraviolet irradiator 2 can be temporarily reduced (step S33). Accordingly, initial air in the active space H1 can flow into the non-active space H2. Thus, the initial air, which is different from the predetermined atmosphere, can be discharged out of the active space H1. Thereafter, the movement mechanism 12 moves the substrate W1 further away from the ultraviolet irradiator 2 (step S34). Accordingly, gas from the second gas supplying unit 42 and gas from the ring space are taken into the active space H1.

As described above, the volume of the active space H1 is temporarily reduced to externally discharge initial air in the active space H1. In this manner, the amount of initial air to be discharged out of the active space H1 by gas from the second gas supplying unit 42 can be reduced in advance. Accordingly, the predetermined atmosphere can be achieved in the active space H1 in a shorter time.

Movement Mechanism 12

In the above-described example, the movement mechanism 12 moves the substrate holding table 1, but may move a pair of the ultraviolet irradiator 2 and the tubular member 3. In other words, the movement mechanism 12 only needs to relatively move the pair of the ultraviolet irradiator 2 and the tubular member 3 and the substrate holding table 1.

Second Through-Hole

In the above-described example, the tubular member 3 includes the two second through-holes 321 and 322, but may include three or more second through-holes. Openings of the three or more second through-holes may be provided, for example, at equal intervals in the circumferential direction.

Figure 24:
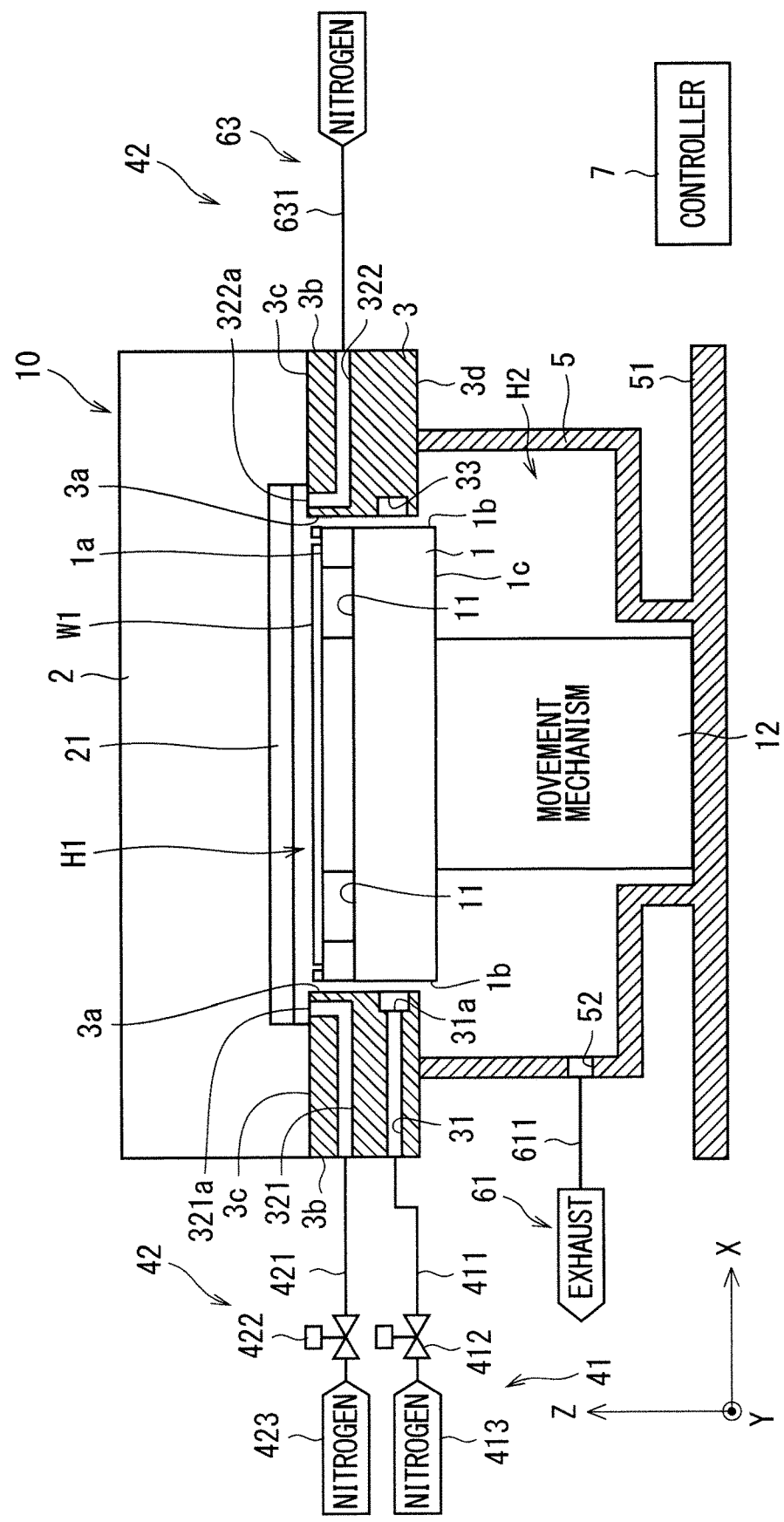
FIG. 24 is a diagram illustrating another exemplary configuration of the substrate processing device.

Although gas is supplied through the second through-holes 321 and 322 in the example illustrated in FIGS. 2 and 3, for example, gas may be supplied through the second through-hole 321, and gas in the active space H1 may be exhausted through the second through-hole 322. FIG. 24 is a diagram schematically illustrating an exemplary configuration of the substrate processing device 10 thus configured. The other end of the second through-hole 322 is connected with a gas exhaust unit 63. Specifically, the gas exhaust unit 63 includes a pipe 631, and the pipe 631 has one end connected with the other end of the second through-hole 322. In this case, the opening 322a functions as a gas exhaust opening.

The tubular member 3 may include a plurality of second through-holes for gas supply and a plurality of second through-holes for gas exhaust. For example, the plurality of second through-holes for gas supply may have openings on one half side of the periphery of the tubular member 3, and the plurality of second through-holes for gas exhaust may have openings on the other half side.

Figure 25:
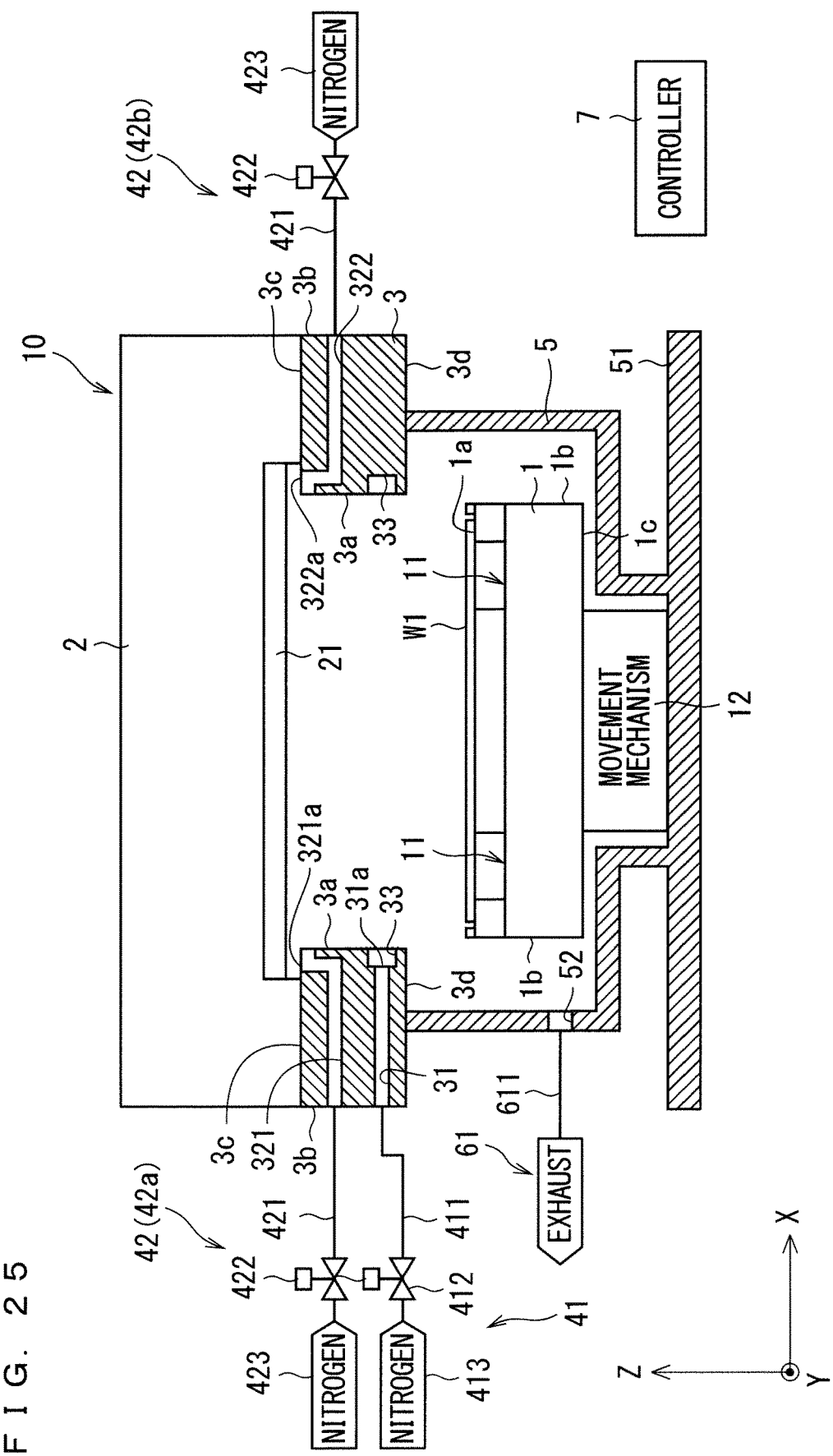
FIG. 25 is a diagram illustrating another exemplary configuration of the substrate processing device.

FIG. 25 is a diagram schematically illustrating another exemplary configuration of the substrate processing device 10. The substrate processing device 10 differs from the substrate processing device 10 illustrated in FIG. 2 in the openings 321a and 322a. As illustrated in FIG. 25, the openings 321a and 322a face toward the ultraviolet irradiator 2 in the Z direction, and also face in the horizontal direction. In other words, the openings 321a and 322a also face toward the inner periphery of the tubular member 3. With this configuration, gas supplied from the openings 321a and 322a can flow in the horizontal direction. One of the openings 321a and 322a may function as a gas supply opening, and the other may function as a gas exhaust opening.

While the invention has been shown and described in detail, the foregoing description is in all aspects illustrative and not restrictive. It is therefore understood that numerous modifications and variations can be devised without departing from the scope of the invention.

What is claimed is:

1. A substrate processing device comprising:
a substrate holding table including a first upper surface on which a substrate is placed and a side surface;
an ultraviolet irradiator disposed above the substrate placed on the first upper surface of the substrate holding table;
a table mover is configured to move the substrate holding table from a second position farther from the ultraviolet irradiator to a first position comparatively closer to the ultraviolet irradiator, to form an active space between the ultraviolet irradiator and the substrate holding table and a non-active space at a position below the substrate holding table, wherein ultraviolet light irradiated from the ultraviolet irradiator acts on the substrate placed on the substrate holding table through the active space,
a tubular member surrounding the entire side surface of the substrate holding table when the substrate holding table is at the first position, and forming a ring space, which communicates with the active space and the non-active space, the ring space being defined between the tubular member and the side surface of the substrate holding table;
a first gas supplying unit configured to supply gas acting as a barrier against air flowing from the non-active space into the active space to the ring space; and
a second gas supplying unit configured to supply gas to the active space, wherein;
the tubular member includes at least one side opening through which the first gas supplying unit supplies the gas acting as the barrier against the air flowing into the active space, to the ring space, the at least one side opening being at at least one position facing the side surface on an inner peripheral surface of the tubular member,
the tubular member includes at least one gas supply opening through which the second gas supplying unit supplies the gas to the active space between the substrate and the ultraviolet irradiator, and
the at least one gas supply opening is disposed on a second upper surface of the tubular member, the second upper surface faces the ultraviolet irradiator in a vertical direction between the second surface and the ultraviolet irradiator through a void space.

2. The substrate processing device according to claim 1, wherein the at least one side opening faces in a circumferential direction of the inner peripheral surface.

3. The substrate processing device according to claim 2, wherein
the at least one side opening includes a plurality of side openings, and the plurality of side openings are arranged at intervals in the circumferential direction of the inner peripheral surface.

4. The substrate processing device according to claim 3, wherein an opening axis of each of the plurality of side openings is aligned with a first direction that is one of a clockwise direction and a counterclockwise direction along the circumferential direction.

5. The substrate processing device according to claim 3, further comprising a rotation mechanism configured to rotate the substrate holding table in a first direction about an axis vertical to a main surface of the substrate.

6. The substrate processing device according to claim 1, wherein
the at least one side opening includes at least one first-layer opening and at least one second-layer opening, and
the at least one first-layer opening is disposed at a position different from the position of the at least one second-layer opening in a second direction in which the ultraviolet irradiator and the substrate holding table are arranged.

7. The substrate processing device according to claim 6, wherein
the at least one first-layer opening includes a plurality of first-layer openings,
the at least one second-layer opening includes a plurality of second-layer openings,
the plurality of first-layer openings are arranged at intervals in the circumferential direction of the inner peripheral surface,
the plurality of second-layer openings are each disposed at a position different from the position of any of the first-layer openings in the circumferential direction, and
an opening axis of each of the first-layer openings and the second-layer openings is aligned with one of clockwise and anticlockwise directions along the circumferential direction.

8. The substrate processing device according to claim 6, wherein
the inner peripheral surface of the tubular member further includes a first groove and a second groove extending in the circumferential direction of the inner peripheral surface,
the first groove and the second groove are disposed at positions different from each other in the second direction,
the at least one first-layer opening is provided to the first groove, and
the at least one second-layer opening is provided to the second groove.

9. The substrate processing device according to claim 1, wherein
the at least one gas supply opening includes a plurality of gas supply openings, and
the plurality of gas supply openings are disposed at intervals in a circumferential direction of the inner peripheral surface.

10. The substrate processing device according to claim 1, wherein the tubular member further includes at least one gas exhaust opening disposed at a position different from the position of the at least one gas supply opening in a circumferential direction of the inner peripheral surface and configured to exhaust gas in the active space between the substrate and the ultraviolet irradiator.

11. The substrate processing device according to claim 10, wherein the at least one gas supply opening is disposed on a half side of the inner peripheral surface in the circumferential direction, and the at least one gas exhaust opening is disposed on the other side of the inner peripheral surface in the circumferential direction.

12. The substrate processing device according to claim 1, wherein
the first upper surface of the substrate holding table includes a conveyance groove extending from a periphery of the first upper surface, and
the substrate holding table includes a gas supply or exhaust conveyance groove opening in the conveyance groove.

13. The substrate processing device according to claim 1, wherein
the substrate holding table includes, on the first upper surface, a plurality of protrusions protruding toward the ultraviolet irradiator and supporting the substrate, and
the substrate holding table includes a gas supply or exhaust upper surface opening at a position different from the positions of the plurality of protrusions on the first upper surface.

14. The substrate processing device according to claim 1, wherein
the first upper surface of the substrate holding table is provided with a plurality of elevation protrusions configured to be elevated and lowered in a direction in which the ultraviolet irradiator and the substrate holding table are arranged, and
a plurality of fixed protrusions protruding toward the ultraviolet irradiator at positions closer to the center of the substrate than the plurality of elevation protrusions,
when the plurality of elevation protrusions is elevated toward the ultraviolet irradiator, the substrate is not supported by the plurality of fixed protrusions but is supported by the plurality of elevation protrusions, and
when the plurality of elevation protrusions is lowered toward the substrate holding table, the substrate is supported by at least the plurality of fixed protrusions.

15. The substrate processing device according to claim 14, wherein the substrate holding table includes a gas supply or exhaust upper surface opening on the first upper surface.

16. The substrate processing device according to claim 1, further comprising:
a partition extending from a lower surface of the tubular member to a lower side in a vertical direction, wherein
a width of the ring space between the side surface of the substrate holding table and the inner peripheral surface of the tubular member at the first position is smaller than a width between the side surface of the substrate holding table and an inner peripheral surface of the partition at the second position.

17. The substrate processing device according to claim 1, wherein
the first position is a position at which the side surface of the substrate holding table opposes to the at least one side opening in a horizontal direction.

18. The substrate processing device according to claim 1, wherein
the second position is a position at which an indexer robot or a conveyance robot places the substrate on the substrate holding table and at which the substrate holding table is in a lower side of the at least one side opening in the vertical direction.

19. The substrate processing device according to claim 1, wherein the second position is a position at which the substrate holding table is in a lower side of the ring space in the vertical direction.

20. The substrate processing device according to claim 1, wherein the second position is a position at which the substrate holding table is in a lower side of the tubular member in the vertical direction.

21. The substrate processing device according to claim 18, further comprising:

a partition extending from a lower surface of the tubular member to a lower side in a vertical direction, wherein the partition includes a shutter through which the indexer robot or the conveyance robot can take the substrate in or out, in the non-active space.

22. The substrate processing device according to claim 1, wherein the inner surface of the tubular member includes a first groove extending in a circumferential direction of the inner surface, and the at least one side opening is provided to the first groove.

23. A substrate processing system, comprising the substrate processing device of claim 1 the substrate processing system comprising:

a housing and holding unit configured to house a substrate;

a substrate processing unit configured to perform processing on the substrate; and a substrate passing unit that is positioned between the housing and holding unit and the substrate processing unit and through which the substrate passes when reciprocated between the housing and holding unit and the substrate processing unit.

* * * * *